US012759325B2

(12) United States Patent
Byun et al.

(10) Patent No.: US 12,759,325 B2
(45) Date of Patent: Oct. 13, 2026

(54) APPARATUS FOR MANUFACTURING DISPLAY DEVICE AND ALIGNING MODULE

(71) Applicant: Samsung Display Co., Ltd., Yongin-si (KR)

(72) Inventors: Jungwoong Byun, Yongin-si (KR); Wonjoon Choi, Yongin-si (KR); Cheongwan Min, Yongin-si (KR); Dohun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 562 days.

(21) Appl. No.: 18/446,824

(22) Filed: Aug. 9, 2023

(65) Prior Publication Data

US 2024/0284773 A1 Aug. 22, 2024

(30) Foreign Application Priority Data

Feb. 21, 2023 (KR) ........................ 10-2023-0023152

(51) Int. Cl.

| | |
|---|---|
| ***B41J 25/304*** | (2006.01) |
| ***H10K 71/10*** | (2023.01) |
| ***H10K 71/13*** | (2023.01) |
| *H10K 59/12* | (2023.01) |

(52) U.S. Cl.

CPC ............ *B41J 25/304* (2013.01); *H10K 71/13* (2023.02); *H10K 71/191* (2023.02); *H10K 59/1201* (2023.02)

(58) Field of Classification Search

CPC ...................................................... B41J 25/304

See application file for complete search history.

(56) References Cited

U.S. PATENT DOCUMENTS

| | | | | |
|---|---|---|---|---|
| 8,141,977 | B2 | 3/2012 | Lee et al. | |
| 8,348,368 | B2 | 1/2013 | Kim et al. | |
| 2005/0134672 | A1 * | 6/2005 | Williams | B41J 2/2135 347/214 |
| 2014/0168293 | A1 * | 6/2014 | Moreau | B41J 25/34 347/14 |
| 2015/0022588 | A1 * | 1/2015 | Rodriguez | B41J 2/155 347/40 |
| 2016/0039212 | A1 * | 2/2016 | Elferink | B41J 25/001 347/20 |
| 2020/0023658 | A1 * | 1/2020 | Ko | B41J 19/00 |

FOREIGN PATENT DOCUMENTS

| | | |
|---|---|---|
| KR | 10-0811231 | 3/2008 |
| KR | 10-2008-0105669 | 12/2008 |
| KR | 10-1023892 | 3/2011 |
| KR | 10-1063952 | 9/2011 |

* cited by examiner

*Primary Examiner* — Shelby L Fidler

(74) *Attorney, Agent, or Firm* — Innovation Counsel LLP

(57) ABSTRACT

An apparatus for manufacturing a display apparatus includes a stage on which a substrate is mounted, and an ink ejection module that discharges ink onto the substrate. The ink ejection module includes a head including multiple ejection holes through which the ink is sprayed, and an alignment module that is connected to the head and aligns the head, the alignment module includes a first alignment portion, and a second alignment portion which moves relative to the first alignment portion and to which the head is fixed, and the first alignment portion includes a first alignment frame, and a first operating portion that is fixed to the first alignment frame and presses the second alignment portion in a first direction.

18 Claims, 16 Drawing Sheets

APPARATUS FOR MANUFACTURING DISPLAY DEVICE AND ALIGNING MODULE

CROSS REFERENCE TO RELATED APPLICATION(S)

This application claims priority to and benefits of Korean Patent Application No. 10-2023-0023152 under 35 U.S.C. § 119, filed on Feb. 21, 2023, in the Korean Intellectual Property Office (KIPO), the entire contents of which are incorporated herein by reference.

BACKGROUND

1. Technical Field

Embodiments relate to an apparatus for manufacturing a display apparatus, and an alignment module.

2. Description of the Related Art

Mobility-based electronic devices have been widely used. In addition to small electronic devices, such as mobile phones or the like, tablet personal computers (PCs) have been recently in wide use as mobile electronic devices.

The electronic devices such as mobile electronic devices or the like include display devices to provide visual information, for example, images or moving images, to users to support various functions. Recently, as components for driving display devices decrease in size, display devices tend to become increasingly important in electronic devices, and a structure that may be bent to have an angle in a flat state has been devised.

SUMMARY

The disclosure provides an apparatus for manufacturing a display apparatus, in which a head is quickly and accurately aligned.

However, the scope of the disclosure is not limited thereto.

Additional aspects will be set forth in part in the description which follows and, in part, will be apparent from the description, or may be learned by practice of the embodiments of the disclosure.

According to an embodiment, an apparatus for manufacturing a display apparatus may include a stage on which a substrate is mounted, and an ink ejection module that discharges ink onto the substrate. The ink ejection module may include a head including a plurality of ejection holes through which the ink is sprayed, and an alignment module that is connected to the head and aligns the head, the alignment module may include a first alignment portion, and a second alignment portion which moves relative to the first alignment portion and to which the head is fixed, and the first alignment portion may include a first alignment frame, and a first operating portion that is fixed to the first alignment frame presses the second alignment portion in a first direction.

The alignment module may further include a first connection member connecting the first alignment portion to the second alignment portion such that an attractive force parallel to the first direction, is applied between the first alignment portion and the second alignment portion.

The first operating portion may include a first motor fixed to the first alignment frame and linearly moving in the first direction, and a first bearing having a spherical shape, contacting a side of the first motor, and linearly moving in the first direction.

The second alignment portion may include a second alignment frame, and a first contact member including a glass, fixed to the second alignment frame, and contacting the first bearing.

The first alignment portion may include a second operating portion that is fixed to the first alignment frame and presses the second alignment portion in the first direction, and a third operating portion that is fixed to the first alignment frame at a location and presses the second alignment portion in the first direction. The first operating portion, the second operating portion, and the third operating portion may be fixed to the first alignment frame at different location.

The first alignment portion may further include a fourth operating portion that is fixed to the first alignment frame and presses the second alignment portion in a second direction intersecting the first direction.

The alignment module may further include a fourth connection member connecting the first alignment portion to the second alignment portion such that an attractive force parallel to the second direction, is applied between the first alignment portion and the second alignment portion.

The fourth operating portion may include a fourth motor fixed to the first alignment frame, linearly moving in the first direction, and including an inclined surface, and a fourth bearing having a spherical shape, contacting the inclined surface of the fourth motor, and linearly moving in the second direction.

The second alignment portion may include a second alignment frame, and a fourth contact member including a glass, fixed to the second alignment frame, and contacting the fourth bearing.

The first alignment portion may further include a fifth operating portion that is fixed to the first alignment frame and presses the second alignment portion in the second direction. The fifth operation portion and the fourth operating portion may be fixed to the first alignment frame at different locations.

The first alignment portion may further include a sixth operating portion that is fixed to the first alignment frame and presses the second alignment portion in a third direction intersecting the first direction and the second direction. The fourth operating portion, the fifth operating portion, and the sixth operating portion may be fixed to the first alignment frame at different locations.

The alignment module may further include a sixth connection member connecting the first alignment portion to the second alignment portion such that an attractive force parallel to the third direction, is applied between the first alignment portion and the second alignment portion.

The sixth operating portion may include a sixth motor fixed to the first alignment frame, linearly moving in the first direction, and including an inclined surface, and a sixth bearing having a spherical shape, contacting the inclined surface of the sixth motor, and linearly moving in the third direction.

The second alignment portion may include a second alignment frame, and a sixth contact member including a glass, fixed to the second alignment frame, and contacting the sixth bearing.

The apparatus may further include a sensor that senses location information of the alignment module, and a controller that controls the ink ejection module. The controller may primarily align the ink ejection module based on the location information of the alignment module.

The sensor may sense location information of the head, the controller may secondarily align the ink ejection module based on the location information of the head.

According to an embodiment, an alignment module may include a first alignment portion, and a second alignment portion which moves relative to the first alignment portion and to which the head is fixed. The first alignment portion may include a first alignment frame, and a first operating portion that is fixed to the first alignment frame and presses the second alignment portion in a first direction.

The alignment module may further include a first connection member connecting the first alignment portion to the second alignment portion such that an attractive force parallel to the first direction, is applied between the first alignment portion and the second alignment portion.

The first operating portion may include a first motor fixed to the first alignment frame and linearly moving in the first direction, and a first bearing having a spherical shape, contacting a side of the first motor, and linearly moving in the first direction.

The second alignment portion may include a second alignment frame, and a first contact member including a glass, fixed to the second alignment frame, and contacting the first bearing.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
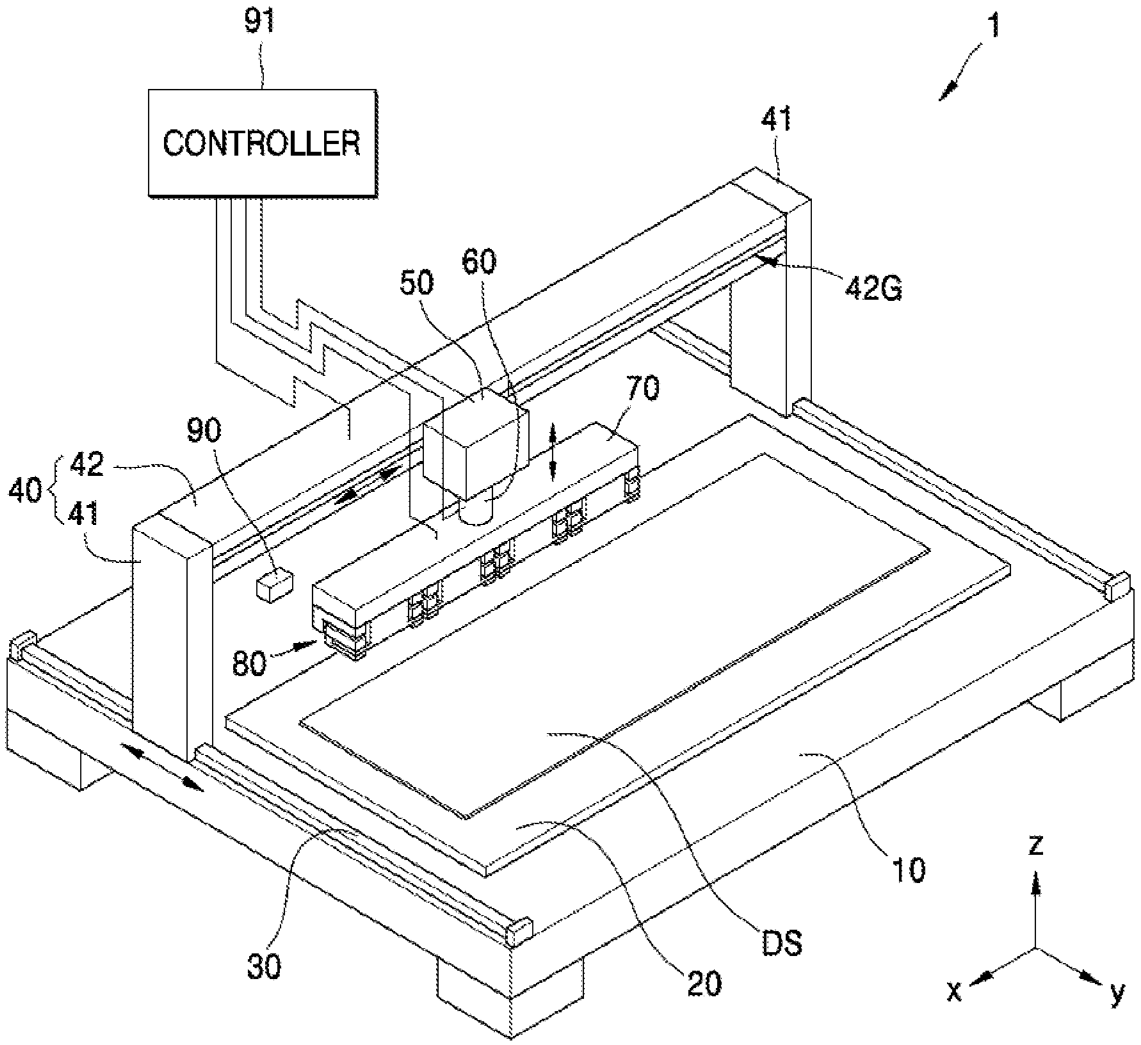
FIG. 1 is a schematic perspective view of an apparatus for manufacturing a display apparatus according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, particular embodiments will be shown in the drawings and described in detail in the written description. The attached drawings for illustrating embodiments of the disclosure are referred to in order to gain a sufficient understanding of the disclosure, the merits thereof, and the objectives accomplished by the implementation of the disclosure. The disclosure may, however, be embodied in many different forms and should not be construed as being limited to the embodiments set forth herein.

Hereinafter, an embodiment of the disclosure will be described in detail with reference to the accompanying drawings. Like elements in the drawings denote like elements, and repeated descriptions thereof are omitted.

It will be understood that although the terms "first," "second," etc. may be used herein to describe various elements, these elements should not be limited by these terms, and these elements are only used to distinguish one element from another. Thus, a first element discussed below could be termed a second element without departing from the teachings of the disclosure.

As used herein, the singular forms "a," "an," and "the" are intended to include the plural forms as well, unless the context clearly indicates otherwise.

It will be further understood that the terms "comprises," "includes," "comprising," and/or "including" used herein specify the presence of stated features, integers, steps, operations, elements, elements, and/or groups thereof, but do not preclude the presence or addition of one or more other features or elements.

It will be understood that when a layer, region, or element is referred to as being "on", "formed on", or "connected to" another layer, region, or element, it can be directly or indirectly on, formed on, or connected to the other layer, region, or element. For example, intervening layers, regions, or elements may be present. When, however, an element or layer is referred to as being "directly on," "directly formed on," or "directly connected to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "under," "lower," "above," "upper," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Sizes of elements in the drawings may be exaggerated or reduced for convenience of explanation. In other words, since sizes and thicknesses of elements in the drawings are arbitrarily illustrated for convenience of explanation, the disclosure is not limited thereto. Further, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The display surface may be parallel to a surface defined by the x-axis and the y-axis. A normal direction of the display surface, i.e., a thickness direction of the display device 1, may indicate the z-axis. In this specification, an expression of "when viewed from the top or in a plan view" may represent a case when viewed in the z-axis. Hereinafter, a front surface (or a top surface) and a rear surface (or a bottom surface) of each of layers or units may be distinguished by the z-axis. However, directions indicated by the x-axis, the y-axis, and the z-axis may be a relative concept, and converted with respect to each other, e.g., converted into opposite directions.

When a certain embodiment may be implemented differently, a specific process order may be performed differently from the described order. For example, two consecutively described processes may be performed substantially at the same time or performed in an order opposite to the described order.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic perspective view of an apparatus for manufacturing a display apparatus according to an embodiment.

Referring to FIG. 1, the apparatus 1 for manufacturing a display apparatus may include a support 10, a stage 20, a guide portion 30, a first moving portion 40, a second moving portion 50, a third moving portion 60, a connection frame 70, an ink ejection module 80, a sensor 90, and a controller 91.

The support 10 may support the stage 20, the guide portion 30, the first moving portion 40, the second moving portion 50, the third moving portion 60, the connection frame 70, the ink ejection module 80, the sensor 90, and the controller 91. FIG. 1 shows that the support 10 has a hexahedral shape. However, the shape of the support 10 is not limited thereto.

The stage 20 may be disposed on the support 10. A display substrate DS (or a substrate) may be mounted on the stage 20. The stage 20 may include an alignment mark for aligning the display substrate DS. The display substrate DS may be part of a display apparatus that is being manufactured, and may be a target to which ink is ejected from the ink ejection module 80. The stage 20 may form a workstation of an inkjet printing process.

The guide portion 30 may be disposed on the support 10. For example, the apparatus 1 may include two guide portions 30, and the guide portions 30 may be arranged apart from each other in an ±x-axis direction on both sides of the support 10 with the stage 20 disposed between the both sides of the support 10. A length of the guide portion 30 may be greater than at least a length of an edge of the display substrate DS in a direction (for example, ±y-axis direction intersecting the ±x-axis direction). The guide portion 30 may guide the first moving portion 40 to linearly move along a lengthwise direction (e.g., a ±y-axis direction) of the guide portion 30. For example, the guide portion 30 may include a linear motion rail.

The first moving portion 40 may be disposed on the support 10 and linearly reciprocate with respect to the stage 20 in the ±y-axis direction. The first moving portion 40 may include column members 41 and a horizontal member 42. FIG. 1 shows that the column member 41 and the horizontal member 42 each have a cuboid rod shape, but the shapes of the column member 41 and the horizontal member 42 are not limited thereto.

The column member 41 may be connected to the guide portion 30. For example, the apparatus 1 may include two column members 41, and the column members 41 may be arranged apart from each other in the ±x-axis direction with the stage 20 disposed between the column members 41. The column member 41 may move along the lengthwise direction (e.g., the ±y-axis direction) of the guide portion 30. The column member 41 may perform a linear motion manually or automatically by including a motor cylinder or the like. For example, the column member 41 may include a linear motion block moving along the linear motion rail and may automatically linearly move.

The horizontal member 42 may be fixed to the column members 41. The horizontal member 42 may be arranged between two column members 41. The horizontal member 42 may include a horizontal groove 42G arranged in a lengthwise direction. The horizontal groove 42G may be arranged on a side surface of the horizontal member 42. The horizontal groove 42G may guide the second moving portion 50 to linearly reciprocate along the lengthwise direction (e.g., the ±x-axis direction) of the horizontal member 42.

The second moving portion 50 may be connected to the first moving portion 40 and linearly reciprocate with respect to the first moving portion 40 in the x-axis direction. For example, at least a portion of the second moving portion 50 may be accommodated in the horizontal groove 42G of the horizontal member 42. The second moving portion 50 may move along the lengthwise direction (e.g., the ±x-axis direction) of the horizontal member 42. For example, the second moving portion 50 may include a linear motor or the like.

The third moving portion 60 may be connected to the second moving portion 50 and linearly reciprocate with respect to the second moving portion 50. For example, the third moving portion 60 may be disposed on a lower surface (e.g., a surface in a −z-axis direction intersecting the x-axis direction and the y-axis direction) of the second moving portion 50. The lower surface (e.g., the surface in the −z-axis direction) of the second moving portion 50 may be a surface of the second moving portion 50 that faces the stage 20. For example, the third moving portion 60 may include a pneumatic cylinder or the like. The third moving portion 60 may rotate around a rotation axis (e.g., a z-axis), and the third moving portion 60 may include an electric motor, a pneumatic motor or the like.

The connection frame 70 may be connected to the third moving portion 60. For example, the connection frame 70 may be disposed on a lower surface (e.g., a surface in the −z-axis direction) of the third moving portion 60. The lower surface (e.g., the surface in the −z-axis direction) of the third moving portion 60 may be a surface of the third moving portion 60 that faces the stage 20. Directions in which the first moving portion 40, the second moving portion 50, and the third moving portion 60 (e.g., the ±x-axis direction, the ±y-axis-direction, and the ±z-axis direction) move may intersect each other. In the above configuration, the connection frame 70 may freely move to a designated location in three dimensions.

The ink ejection module 80 may be connected to the connection frame 70. For example, the ink ejection module 80 may be disposed on a lower surface (e.g., a surface in the −z-axis direction) of the connection frame 70. The lower surface of the connection frame 70 (e.g., the surface in the −z-axis direction) may be a surface of the connection frame 70 that faces the stage 20. In the above configuration, the ink ejection module 80 may freely move to a designated location in three dimensions. The ink ejection module 80 may eject ink to a substrate (e.g., the display substrate DS).

The apparatus 1 may include multiple ink ejection modules 80, and the ink ejection modules 80 may be arranged in line in the x-axis direction. FIG. 1 shows four ink ejection modules 80, but the number of ink ejection modules 80 is not limited thereto.

The sensor 90 may be disposed on the support 10. The sensor 90 may be fixed to the support 10 and sense location information of the ink ejection module 80. The controller 91 may control operations of the first moving portion 40, the second moving portion 50, the third moving portion 60, and the ink ejection module 80. The sensor 90 and the controller 91 are described below in detail.

Figure 2:
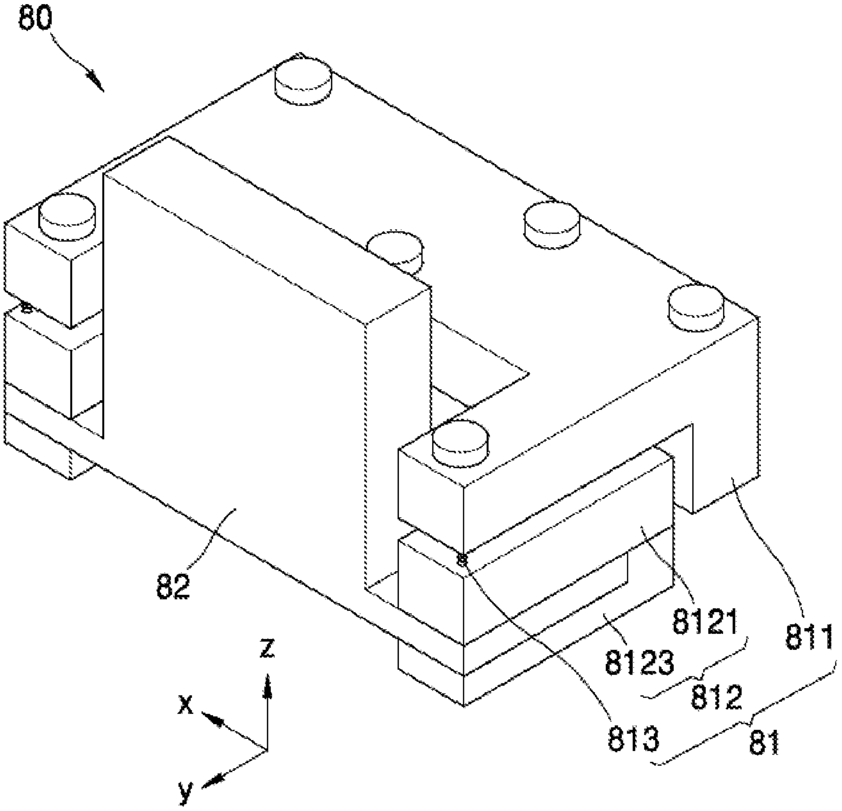
FIG. 2 is a schematic perspective view of an ink ejection module according to an embodiment.
Figure 3:
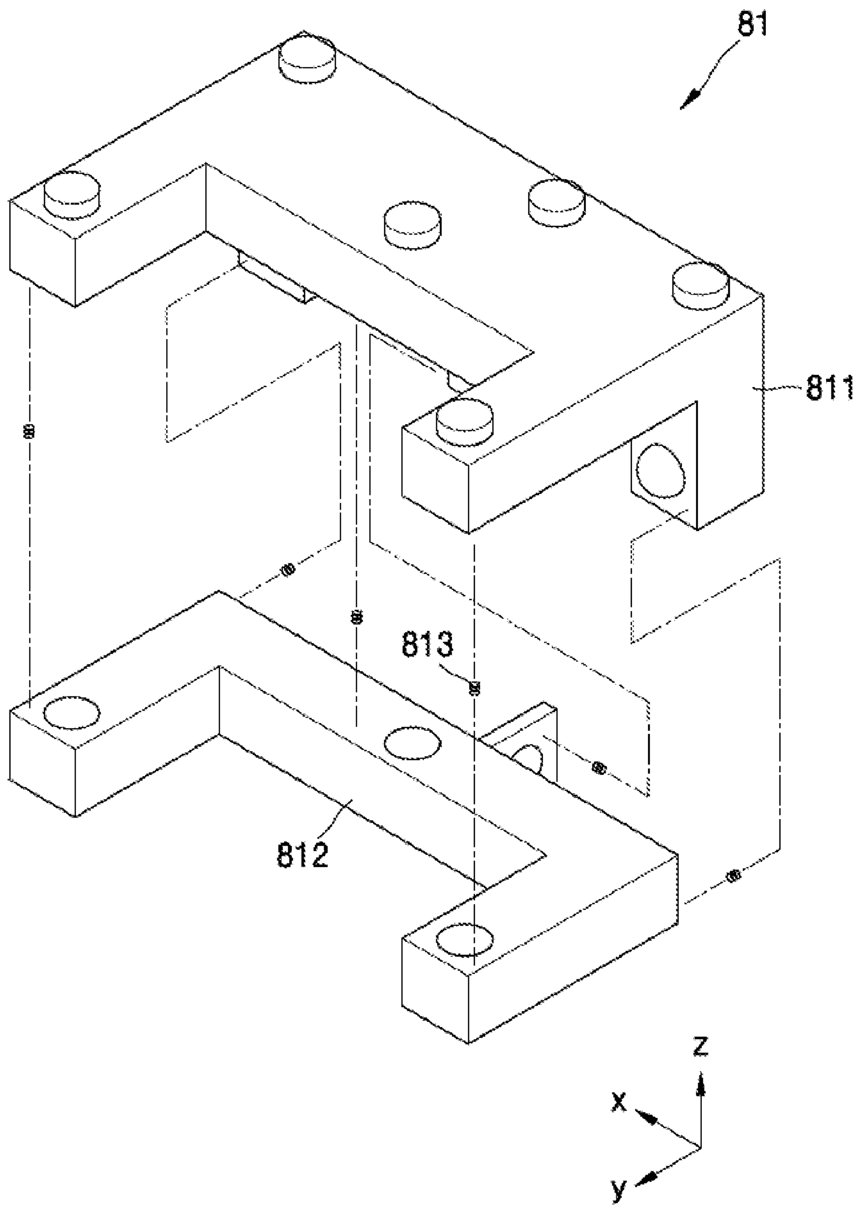
FIGS. 3 and 4 are schematic exploded perspective views of a portion of an alignment module according to an embodiment.
Figure 4:
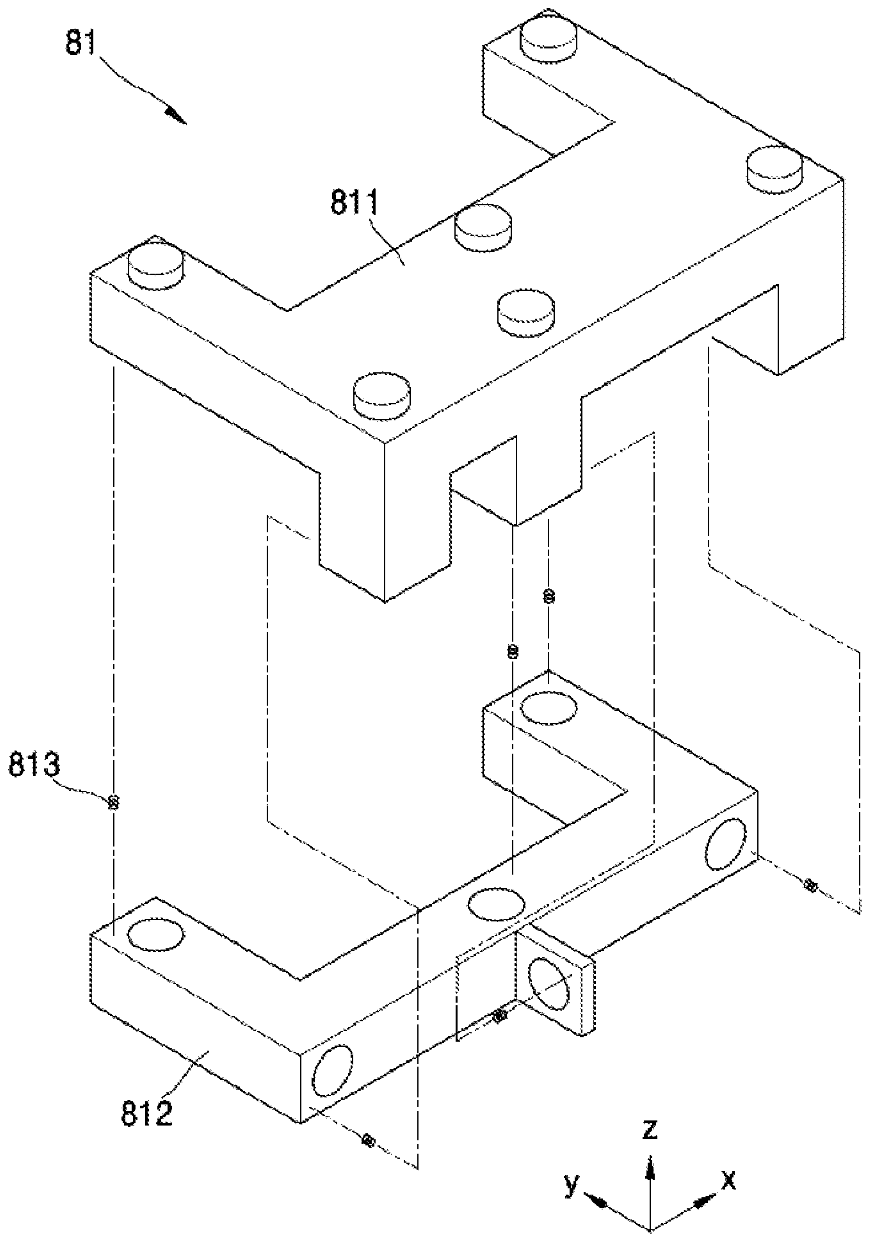

FIG. 2 is a schematic perspective view of an ink ejection module according to an embodiment, and FIGS. 3 and 4 are schematic exploded perspective views of a portion of an alignment module according to an embodiment.

For convenience of explanation, a fixing part 8123 of the second alignment 812 is omitted in FIGS. 3 and 4.

Referring to FIGS. 1 to 4, the ink ejection module 80 may include an alignment module 81 and a head 82.

The alignment module 81 may be connected to the head 82 and align the head 82. The alignment module 81 may include a first alignment portion 811, a second alignment portion 812, and a connection member 813.

The first alignment portion 811 may be fixed to the connection frame 70. The first alignment portion 811 may not move relative to the connection frame 70.

The second alignment portion 812 may be connected to the first alignment portion 811 to move relative to the alignment portion 811. The second alignment portion 812 may move relative to the first alignment portion 811 due to an interaction between the first alignment portion 811 and the second alignment portion 812.

The head 82 may be fixed to the second alignment portion 812. For example, the second alignment portion 812 and the head 82 may not move relative to each other. For example, the second alignment portion 812 may include a second alignment frame 8121 and the fixing part 8123. In the above structure, the fixing part 8123 may fix the head 82 to the second alignment frame 8121. For example, the second alignment frame 8121, the fixing part 8123, and the head 92 may not move relative to each other.

The connection member 813 may connect the first alignment portion 811 to the second alignment portion 812. The connection member 813 may apply an attractive force between the first alignment portion 811 and the second alignment portion 812. The connection member 813 may include an elastic material. For example, the connection member 813 may include a spring or the like. While stretched, the connection member 813 may be arranged between the first alignment portion 811 and the second alignment portion 812, and due to a restoring force of the connection member 813, an attractive force may be generated between the first alignment portion 811 and the second alignment portion 812.

The head 82 may include multiple ejection holes (see, e.g., 82H of FIG. 13) from which ink is ejected. The ink sprayed from the head 82 may be attached to the display substrate DS such that layers of the display apparatus may be formed.

While the first alignment portion 811 is fixed to the connection frame 70, the second alignment portion 812 may move relative to the first alignment portion 811. The head 82 fixed to the second alignment portion 812 may also move relative to the first alignment portion 811. As a result, while the head 82 moves relative to the connection frame 70, the head 82 may be aligned.

Figure 5:
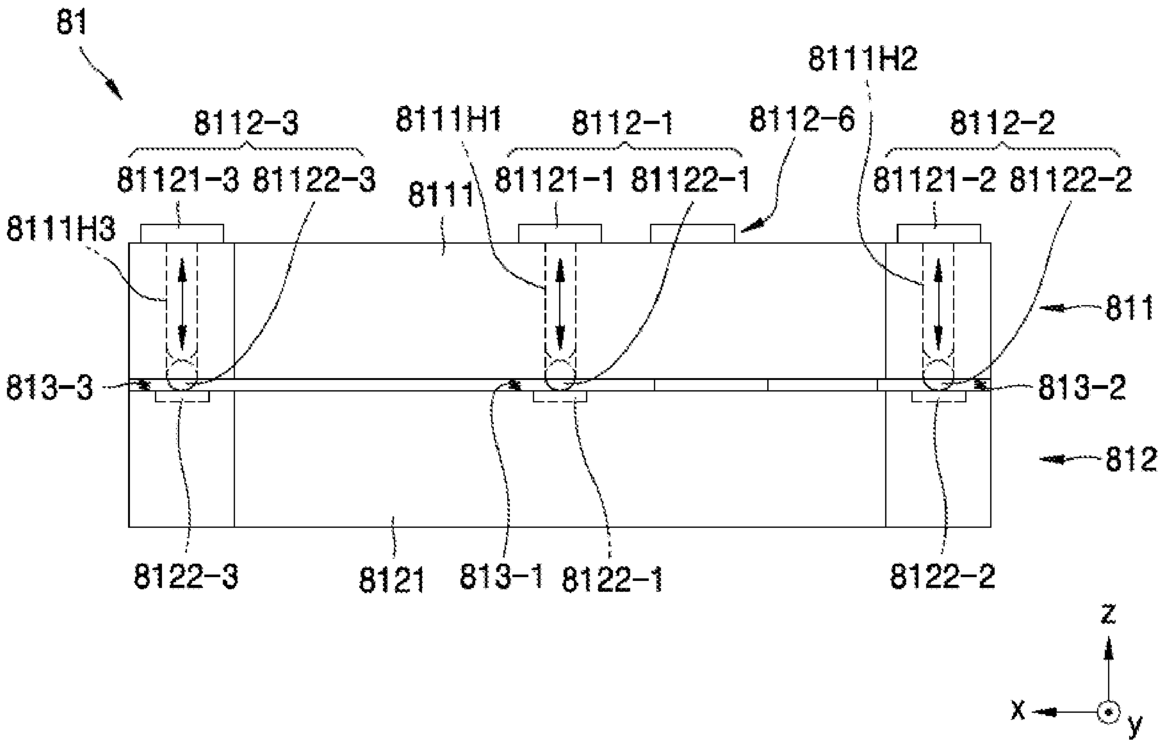
FIG. 5 is a schematic front view of the alignment module according to an embodiment.

FIG. 5 is a schematic front view of the alignment module according to an embodiment.

The connection member 813 described with reference to FIGS. 2 to 4 may include a first connection member 813-1, a second connection member 813-2, and a third connection member 813-3. For convenience of explanation, the fixing part 8123 of the second alignment portion 812 is omitted in FIG. 5.

Referring to FIG. 5, the first alignment portion 811 may include a first alignment frame 8111, a first operating portion 8112-1, a second operating portion 8112-2, and a third operating portion 8112-3.

The first alignment frame 8111 may form the exterior of the first alignment portion 811. In a plan view (view in a first direction, e.g., a −z-axis direction), the first alignment frame 8111 may have a '[' shape. In the first alignment frame 8111, a first alignment hole 8111H1, a second alignment hole 8111H2, and a third alignment hole 8111H3, all of which extend in the first direction (e.g., the −z-axis direction), may be arranged in an ±x-axis direction. The first alignment hole 8111 H1, the second alignment hole 8111H2, and the third alignment hole 8111H3 may penetrate the first alignment frame 8111 in the first direction (e.g., the −z-axis direction). The first alignment hole 8111 H1, the second alignment hole 8111H2, and the third alignment hole 8111H3 may be arranged at different locations not to overlap each other in a plan view (e.g., a −z-axis direction).

The first operating portion 8112-1 may be fixed to the first alignment frame 8111 and press the second alignment portion 812 in the first direction (e.g., the −z-axis direction). The first operating portion 8112-1 may include a first motor 81121-1 and a first bearing 81122-1.

The first motor 81121-1 may be fixed to the first alignment frame 8111. The first motor 81121-1 may include a linear motor and linearly reciprocate along the first direction (e.g., the −z-axis direction). For example, the first motor 81121-1 may include a piezo motor, a voice coil motor (VCM), or the like. At least a portion of the first motor 81121-1 may be accommodated in the first alignment hole 8111H1. The portion of the first motor 81121-1, which is accommodated in the first alignment hole 8111H1 may linearly reciprocate in the first direction (e.g., the −z-axis direction).

The first bearing 81122-1 may contact a side of the first motor 81121-1. The first bearing 81122-1 may be disposed under the first motor 81121-1. As the first motor 81121-1 linearly reciprocates along the first direction (e.g., the −z-axis direction), the first bearing 81122-1 may also linearly reciprocate in the first direction (e.g., the −z-axis direction). At least a portion of the first bearing 81122-1 may be arranged in the first alignment hole 8111H1. Therefore, the first bearing 81122-1 may not be separated from the first alignment frame 8111. The first bearing 81122-1 may have a spherical shape, and a side of the first motor 81121-1 may include a curved surface. Therefore, an area, in which the first bearing 81122-1 contacts the first motor 81121-1, may decrease. A friction force between the first motor 81121-1 and the first bearing 81122-1 may be reduced, and the first bearing 81122-1 may readily rotate.

The second operating portion 8112-2 may be fixed to the first alignment frame 8111 and may press the second alignment portion 812 in the first direction (e.g., the −z-axis direction). The location of the first alignment frame 8111 where the second operation portion 8112-2 is fixed and the location of the first alignment frame 8111 where the first operating portion 8112-1 is fixed may be different. The second operating portion 8112-2 may include a second motor 81121-2 and a second bearing 81122-2.

The second motor 81121-2 may be fixed to the first alignment frame 8111. The second motor 81121-2 may include a linear motor and linearly reciprocate along the first direction (e.g., the −z-axis direction). For example, the second motor 81121-2 may include a piezo motor, a VCM, or the like. At least a portion of the second motor 81121-2 may be accommodated in the second alignment hole 8111H2. The portion of the second motor 81121-2, which is accommodated in the second alignment hole 8111H2, may linearly reciprocate in the first direction (e.g., the −z-axis direction).

The second bearing 81122-2 may contact a side of the second motor 81121-2. The second bearing 81122-2 may be disposed under the second motor 81121-2. As the second motor 81121-2 linearly reciprocates along the first direction (e.g., the −z-axis direction), the second bearing 81122-2 may also linearly reciprocate in the first direction (e.g., the −z-axis direction). At least a portion of the second bearing 81122-2 may be arranged in the second alignment hole 8111H2. Therefore, the second bearing 81122-2 may not be separated from the first alignment frame 8111. The second bearing 81122-2 may have a spherical shape, and a side of the second motor 81121-2 may include a curved surface. Therefore, an area, in which the second bearing 81122-2 contacts the second motor 81121-2, may decrease. A friction force between the second motor 81121-2 and the second bearing 81122-2 may be reduced, and the second bearing 81122-2 may readily rotate.

The third operating portion 8112-3 may be fixed to the first alignment frame 8111 at a location and may press the second alignment portion 812 in the first direction (e.g., the −z-axis direction). The location of the first alignment frame 8111 where the third operating portion 8112-3 is fixed, the location of the first alignment frame 8111 where the first operating portion 8112-1 is fixed, and the location of the first alignment frame 8111 where the second operating portion 8112-2 is fixed may be different. The third operating portion 8112-3 may include a third motor 81121-3 and a third bearing 81122-3.

The third motor 81121-3 may be fixed to the first alignment frame 8111. The third motor 81121-3 may include a linear motor and linearly reciprocate along the first direction (e.g., the −z-axis direction). For example, the third motor 81121-3 may include a piezo motor, a VCM, or the like. At least a portion of the third motor 81121-3 may be accommodated in the third alignment hole 8111H3. The portion of the third motor 81121-3, which is accommodated in the third alignment hole 8111H3, may linearly reciprocate in the first direction (e.g., the −z-axis direction).

The third bearing 81122-3 may contact a side of the third motor 81121-3. The third bearing 81122-3 may be disposed under the third motor 81121-3. As the third motor 81121-3 linearly reciprocates along the first direction (e.g., the −z-axis direction), the third bearing 81122-3 may also linearly reciprocate in the first direction (e.g., the −z-axis direction). At least a portion of the third bearing 81122-3 may be arranged in the third alignment hole 8111H3. Therefore, the third bearing 81122-3 may not be separated from the first alignment frame 8111. The third bearing 81122-3 may have a spherical shape, and a side of the third motor 81121-3 may include a curved surface. Therefore, an area, in which the third bearing 81122-3 contacts the third motor 81121-3, may decrease. A friction force between the third motor 81121-3 and the third bearing 81122-3 may be reduced, and the third bearing 81122-3 may readily rotate.

The second alignment portion 812 may include the second alignment frame 8121, a first contact member 8122-1, a second contact member 8122-2, and a third contact member 8122-3.

The second alignment frame 8121 may form the exterior of the second alignment portion 812. The second alignment frame 8121 may have a shape corresponding to the shape of the first alignment frame 8111. For example, in a plan view (view in the first direction, e.g., the −z-axis direction), the second alignment frame 8121 may have '[' shape corresponding to the shape of the first alignment frame 8111.

The first contact member 8122-1 may be fixed to the second alignment frame 8121 corresponding to the first operating portion 8112-1. The first contact member 8122-1 may be disposed on an upper surface (e.g., a surface in a +z-axis direction) of the second alignment frame 8121 and contact the first bearing 81122-1. The first contact member 8122-1 may have a cylindrical disk shape. The first contact member 8122-1 may include a glass or the like. Therefore, the first bearing 81122-1 may roll or slip on the first contact member 8122-1.

The second contact member 8122-2 may be fixed to the second alignment frame 8121 corresponding to the second operating portion 8112-2. The second contact member 8122-2 may be disposed on the upper surface (e.g., the surface in the +z-axis direction) of the second alignment frame 8121 and contact the second bearing 81122-2. The second contact member 8122-2 may have a cylindrical disk shape. The second contact member 8122-2 may include a glass or the like. Therefore, the second bearing 81122-2 may roll or slip on the second contact member 8122-2.

The third contact member 8122-3 may be fixed to the second alignment frame 8121 corresponding to the third operating portion 8112-3. The third contact member 8122-3 may be disposed on the upper surface (e.g., the surface in the +z-axis direction) of the second alignment frame 8121 and contact the third bearing 81122-3. The third contact member 8122-3 may have a cylindrical disk shape. The third contact member 8122-3 may include a glass or the like. Therefore, the third bearing 81122-3 may roll or slip on the third contact member 8122-3.

The first connection member 813-1 may connect the first alignment portion 811 to the second alignment portion 812 at a location adjacent to the first operating portion 8112-1. Because of the first connection member 813-1, an attractive force may be formed between the first alignment portion 811 and the second alignment portion 812 at a location adjacent to the first operating portion 8112-1 parallel to the first direction (e.g., the −z-axis direction). Because of the attractive force formed by the first connection member 813-1, the first bearing 81122-1 may remain (e.g., always remain) contacting the first contact member 8122-1. Also, because of the attractive force formed by the first connection member 813-1, the first bearing 81122-1 may not be separated from the first alignment hole 8111 H1.

The second connection member 813-2 may connect the first alignment portion 811 to the second alignment portion 812 at a location adjacent to the second operating portion 8112-2. Because of the second connection member 813-2, an attractive force may be formed between the first alignment portion 811 and the second alignment portion 812 at the location adjacent to the second operating portion 8112-2 parallel to the first direction (e.g., the −z-axis direction). Because of the attractive force formed by the second connection member 813-2, the second bearing 81122-2 may remain (e.g., always remain) contacting the second contact member 8122-2. Also, because of the attractive force formed by the second connection member 813-2, the second bearing 81122-2 may not be separated from the second alignment hole 8111H2.

The third connection member 813-3 may connect the first alignment portion 811 to the second alignment portion 812 at a location adjacent to the third operating portion 8112-3. Because of the third connection member 813-3, an attractive force may be formed between the first alignment portion 811 and the second alignment portion 812 at the location adjacent to the third operating portion 8112-3 parallel to the first direction (e.g., the −z-axis direction). Because of the attractive force formed by the third connection member 813-3, the third bearing 81122-3 may remain (e.g., always remain) contacting the third contact member 8122-3. Also, because of the attractive force formed by the third connection member 813-3, the third bearing 81122-3 may not be separated from the third alignment hole 8111H3.

Figure 6:
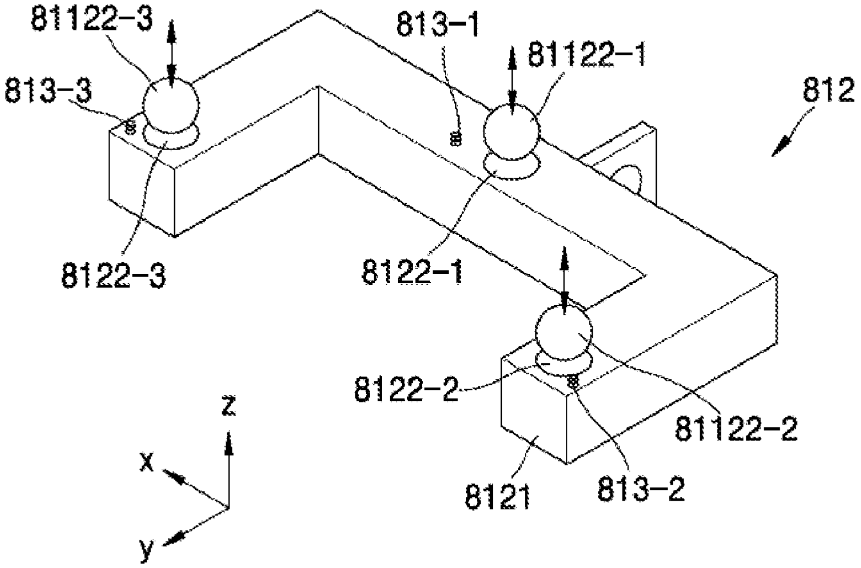
FIG. 6 is a schematic perspective view of a portion of the alignment module according to an embodiment.

FIG. 6 is a schematic perspective view of a portion of the alignment module according to an embodiment.

Referring to FIGS. 1, 2, 5, and 6, the alignment module 81 may align a flatness of the head 82. For example, the alignment module 81 may align the flatness of the head 82 parallel to a plane defined by the x-axis direction and the y-axis direction. For example, the alignment module 81 may align the flatness of the head 82 parallel to the display substrate DS.

The first contact member 8122-1, the second contact member 8122-2, and the third contact member 8122-3 may be arranged at different locations on the second alignment frame 8121 so that a surface of each of the first contact member 8122-1, the second contact member 8122-2, and the third contact member 8122-3 faces a direction (e.g., the +z-axis direction) opposite to the first direction (e.g., the −z-axis direction). Accordingly, the first bearing 81122-1 corresponding to the first contact member 8122-1, the second bearing 81122-2 corresponding to the second contact member 8122-2, and the third bearing 81122-3 corresponding to the third contact member 8122-3 may contact the second alignment frame 8121 at different locations. The first connection member 813-1 corresponding to the first contact member 8122-1, the second connection member 813-2 corresponding to the second contact member 8122-2, and the third connection member 813-3 corresponding to the third contact member 8122-3 may also be connected to the second alignment frame 8121 at different locations.

For example, the first operating portion 8112-1, the second operating portion 8112-2, and the third operating portion 8112-3 may contact the second alignment portion 812 at different locations, and the first connection member 813-1, the second connection member 813-2, and the third connection member 813-3 may also connect the first alignment portion 811 to the second alignment portion 812 at different locations. As the first operating portion 8112-1, the second operating portion 8112-2, and the third operating portion 8112-3 operate, a flatness of the lower surface (e.g., the surface in the −z-axis direction) of the head 82 fixed to the second alignment portion 812 may be adjusted.

Figure 7:
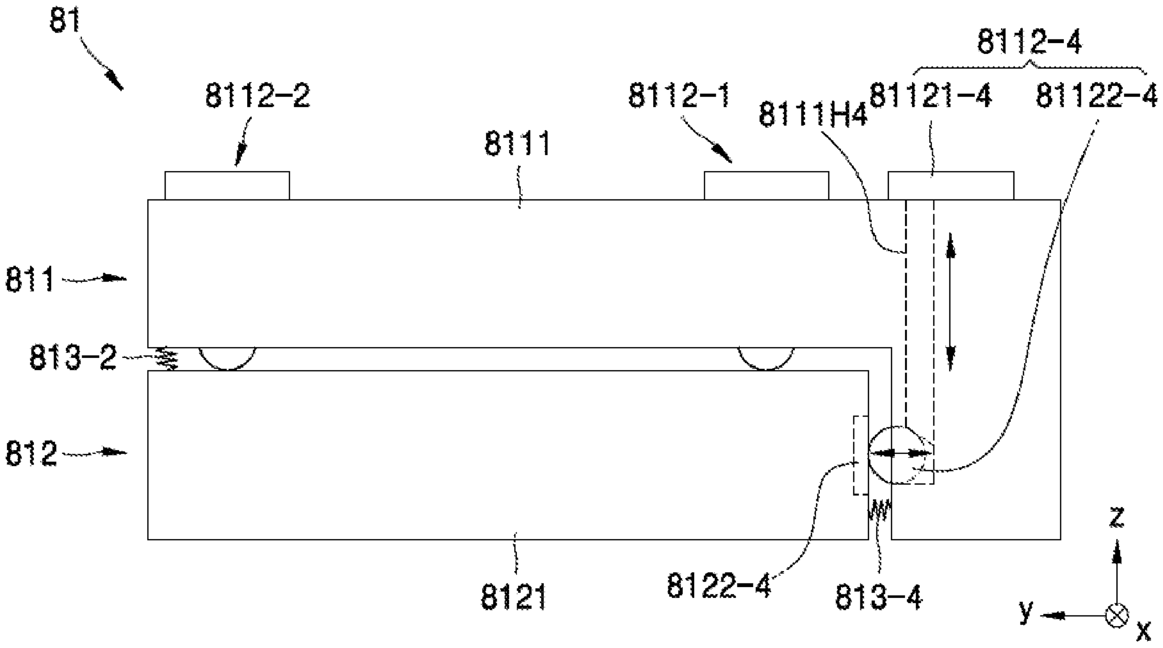
FIG. 7 is a schematic right side view of the alignment module according to an embodiment.

FIG. 7 is a schematic right side view of the alignment module according to an embodiment.

The connection member 813 described with reference to FIGS. 2 to 4 may further include a fourth connection member 813-4 (in addition to the first connection member 813-1, the second connection member 813-2, and the third connection member 813-3 which are described with reference to FIGS. 5 and 6). For convenience of explanation, the fixing part 8123 of the second alignment portion 812 is omitted in FIG. 7.

A fourth alignment hole 8111H4 may be arranged in the first alignment frame 8111. The fourth alignment hole 8111H4 may penetrate the first alignment frame 8111. The fourth alignment hole 8111H4 may be arranged not to overlap the first alignment hole 8111H1, the second alignment hole 8111H2, and the third alignment hole 8111H3 which are described with reference to FIG. 5 in a plan view (e.g., a −z-axis direction).

The fourth alignment hole 8111H4 may have an 'L' shape. The fourth alignment hole 8111H4 may include a fourth-first alignment hole and a fourth-second alignment hole, the fourth-first alignment hole may extend from an upper surface (e.g., the surface in the +z-axis direction) of the first alignment frame 8111 in the first direction (e.g., the −z-axis direction), and the fourth-second alignment hole may extend from an end portion of the fourth-first alignment hole in the second direction (e.g., the +y-axis direction) intersecting the first direction (e.g., the −z-axis direction). As a result, the fourth alignment hole 8111H4 may penetrate the first alignment frame 8111.

The fourth operating portion 8112-4 may be fixed to the first alignment frame 8111 and press the second alignment portion 812 in the second direction (e.g., the +y-axis direction). The fourth operating portion 8112-4 may include a fourth motor 81121-4 and a fourth bearing 81122-4.

The fourth motor 81121-4 may be fixed to the first alignment frame 8111. The fourth motor 81121-4 may include a linear motor and linearly reciprocate along the first direction (e.g., the −z-axis direction). For example, the fourth motor 81121-4 may include a piezo motor, a VCM, or the like. At least a portion of the fourth motor 81121-4 may be accommodated in the fourth-first alignment hole of the fourth alignment hole 8111H4. The portion of the fourth motor 81121-4, which is accommodated in the fourth alignment hole 8111H4, may linearly reciprocate in the first direction (e.g., the −z-axis direction).

The fourth bearing 81122-4 may contact a side of the fourth motor 81121-4. The fourth bearing 81122-4 may be disposed under the fourth motor 81121-4. At least a portion of the fourth bearing 81122-4 may be accommodated in the fourth-second alignment hole of the fourth alignment hole 8111H4. Therefore, the fourth bearing 81122-4 may not be separated from the first alignment frame 8111. A side of the fourth motor 81121-4 may include an inclined surface facing between the first direction (e.g., the −z-axis direction) and the second direction (e.g., the +y-axis direction), and the fourth bearing 81122-4 may have a spherical shape. Therefore, as the first motor 81121-1 linearly reciprocates along the first direction (e.g., the −z-axis direction), the fourth bearing 81122-4 may linearly reciprocate in the second direction (e.g., the +y-axis direction).

The second alignment portion 812 may include a fourth contact member 8122-4. The fourth contact member 8122-4 may be fixed to the second alignment frame 8121 corresponding to the fourth operating portion 8112-4. The fourth contact member 8122-4 may be disposed on a rear surface of the second alignment frame 8121 and contact the fourth bearing 81122-4. The fourth contact member 8122-4 may have a cylindrical disk shape. The first contact member 8122-4 may include a glass or the like. Therefore, the fourth bearing 81122-4 may roll or slip on the fourth contact member 8122-4.

The fourth connection member 813-4 may connect the first alignment portion 811 to the second alignment portion 812 at a location adjacent to the fourth operating portion 8112-4. Because of the fourth connection member 813-4, an attractive force may be formed between the first alignment portion 811 and the second alignment portion 812 at a location adjacent to the fourth operating portion 8112-4 parallel to the second direction (e.g., the +y-axis direction). Because of the attractive force formed by the fourth connection member 813-4, the fourth bearing 81122-4 may remain (e.g., always remain) contacting the fourth contact member 8122-4. Also, because of the attractive force formed by the first connection member 813-1, the fourth bearing 81122-4 may not be separated from the fourth alignment hole 8111H4.

Figure 8:
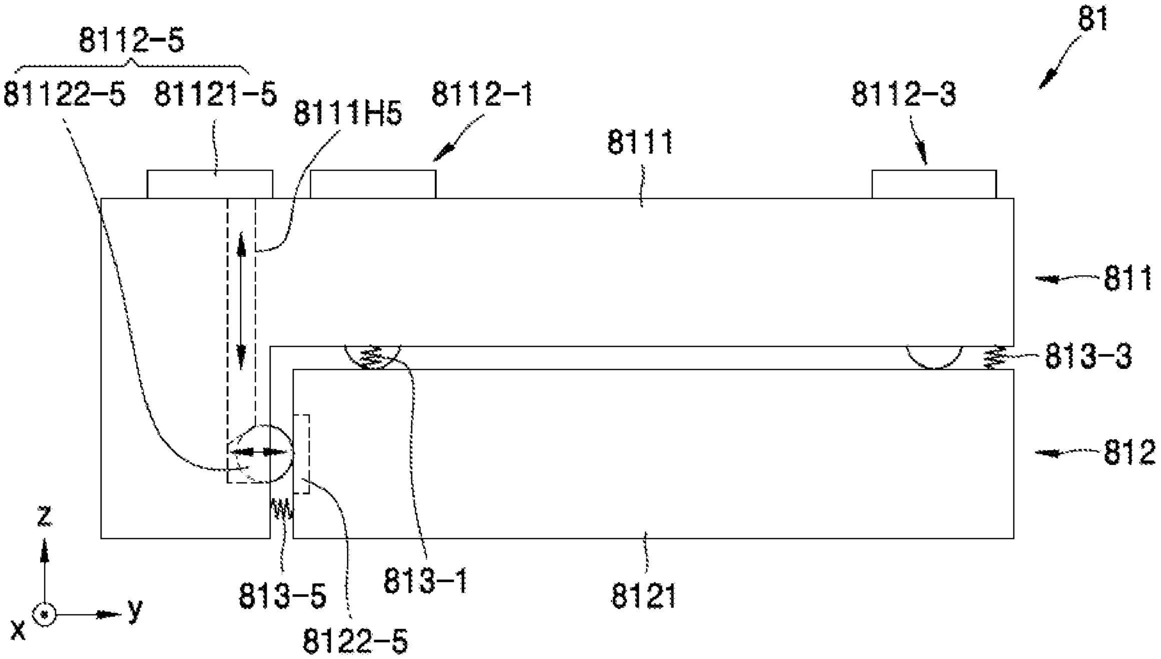
FIG. 8 is a schematic left side view of the alignment module according to an embodiment.

FIG. 8 is a schematic left side view of the alignment module according to an embodiment.

The connection member 813 described with reference to FIGS. 2 to 4 may further include a fifth connection member 813-5 (in addition to the first connection member 813-1, the second connection member 813-2, the third connection member 813-3, and the fourth connection member 813-4 which are described with reference to FIGS. 5 to 7). For convenience of explanation, the fixing part 8123 of the second alignment portion 812 is omitted in FIG. 8.

A fifth alignment hole 8111H5 may be arranged in the first alignment frame 8111. The fifth alignment hole 8111H5 may penetrate the first alignment frame 8111. The fifth alignment hole 8111H5 may be disposed not to overlap the first alignment hole 8111H1, the second alignment hole 8111H2, and the third alignment hole 8111H3, which are described with reference to FIG. 5, and the fourth alignment hole 8111H4 described with reference to FIG. 7 in a plan view (e.g., a −z-axis direction).

The fifth alignment hole 8111H5 may have an 'L' shape. The fifth alignment hole 8111H5 may include a fifth-first alignment hole and a fifth-second alignment hole, the fifth-first alignment hole may extend from the upper surface (e.g., the surface in the +z-axis direction) of the first alignment frame 8111 in the first direction (e.g., the −z-axis direction), and the fifth-second alignment hole may extend from an end portion of the fifth-first alignment hole in the second direction (e.g., the +y-axis direction) intersecting the first direction (e.g., the −z-axis direction). As a result, the fifth alignment hole 8111H5 may penetrate the first alignment frame 8111.

The fifth operating portion 8112-5 may be fixed to the first alignment frame 8111 and press the second alignment portion 812 in the second direction (e.g., the +y-axis direction). The fifth operating portion 8112-5 may include a fifth motor 81121-5 and a fifth bearing 81122-5.

The fifth motor 81121-5 may be fixed to the first alignment frame 8111. The fifth motor 81121-5 may include a linear motor and linearly reciprocate along the first direction (e.g., the −z-axis direction). For example, the fifth motor 81121-5 may include a piezo motor, a VCM, or the like. At least a portion of the fifth motor 81121-5 may be accommodated in the fifth-first alignment hole of the fifth alignment hole 8111H5. The portion of the fifth motor 81121-5, which is accommodated in the fifth alignment hole 8111H5, may linearly reciprocate in the first direction (e.g., the −z-axis direction).

The fifth bearing 81122-5 may contact a side of the fifth motor 81121-5. The fifth bearing 81122-5 may be disposed under the fifth motor 81121-5. At least a portion of the fifth bearing 81122-5 may be accommodated in the fifth-second alignment hole of the fifth alignment hole 8111H5. Therefore, the fifth bearing 81122-5 may not be separated from the first alignment frame 8111. A side of the fifth motor 81121-5 may include an inclined surface facing between the first direction (e.g., the −z-axis direction) and the second direction (e.g., the +y-axis direction), and the fifth bearing 81122-5 may have a spherical shape. Therefore, as the first motor 81121-1 linearly reciprocates along the first direction (e.g., the −z-axis direction), the fifth bearing 81122-5 may linearly reciprocate in the second direction (e.g., the +y-axis direction).

The second alignment portion 812 may include a fifth contact member 8122-5. The fifth contact member 8122-5 may be fixed to the second alignment frame 8121 corresponding to the fifth operating portion 8112-5. The fifth contact member 8122-5 may be disposed on the rear surface of the second alignment frame 8121 and contact the fifth bearing 81122-5. The fifth contact member 8122-5 may have a cylindrical disk shape. The fifth contact member 8122-5 may include a glass or the like. Therefore, the fifth bearing 81122-5 may roll or slip on the fifth contact member 8122-5.

The fifth connection member 813-5 may connect the first alignment portion 811 to the second alignment portion 812 at a location adjacent to the fifth operating portion 8112-5. Because of the fifth connection member 813-5, an attractive force may be formed between the first alignment portion 811 and the second alignment portion 812 at the location adjacent to the fifth operating portion 8112-5 parallel to the second direction (e.g., the +y-axis direction). Because of the attractive force formed by the fifth connection member 813-5, the fifth bearing 81122-5 may remain (e.g., always remain) contacting the fifth contact member 8122-5. Also, because of the attractive force formed by the fifth connection member 813-5, the fifth bearing 81122-5 may not be separated from the fifth alignment hole 8111H5.

Figure 9:
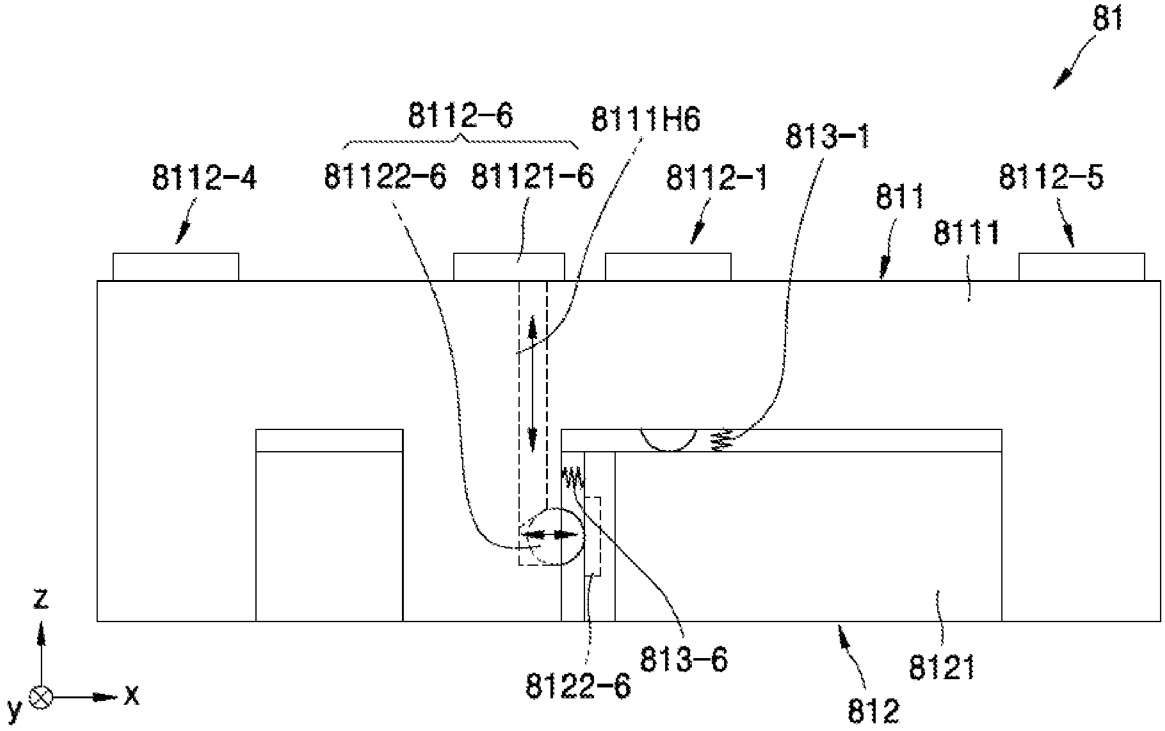
FIG. 9 is a schematic rear view of the alignment module according to an embodiment.

FIG. 9 is a schematic rear view of the alignment module according to an embodiment.

The connection member 813 described with reference to FIGS. 2 to 4 may further include a sixth connection member 813-6 (in addition to the first connection member 813-1, the second connection member 813-2, the third connection member 813-3, the fourth connection member 813-4, and the fifth connection member 813-5 which are described with reference to FIGS. 5 to 8). For convenience of explanation, the fixing part 8123 of the second alignment portion 812 is omitted in FIG. 8.

A sixth alignment hole 8111H6 may be arranged in the first alignment frame 8111. The sixth alignment hole 8111H6 may penetrate the first alignment frame 8111. The sixth alignment hole 8111H6 may be disposed not to overlap the first alignment hole 8111H1, the second alignment hole 8111H2, and the third alignment hole 8111H3, which are described with reference to FIG. 5, the fourth alignment hole 8111H4, which is described with reference to FIG. 7, and the fifth alignment hole 8111H5, which is described with reference to FIG. 8 in a plan view (e.g., a −z-axis direction).

The sixth alignment hole 8111H6 may have an 'L' shape. The sixth alignment hole 8111H6 may include a sixth-first alignment hole and a sixth-second alignment hole, the sixth-first alignment hole may extend from the upper surface (e.g., the surface in the +z-axis direction) of the first alignment frame 8111 in the first direction (e.g., the −z-axis direction), and the sixth-second alignment hole may extend from an end portion of the sixth-first alignment hole in a third direction (e.g., a +x-axis direction) intersecting the first direction (e.g., the −z-axis direction) and the second direction (e.g., the +y-axis direction). As a result, the sixth alignment hole 8111H6 may penetrate the first alignment frame 8111.

The sixth operating portion 8112-6 may be fixed to the first alignment frame 8111 and press the second alignment portion 812 in the third direction (e.g., the +x-axis direction). The sixth operating portion 8112-6 may include a sixth motor 81121-6 and a sixth bearing 81122-6.

The sixth motor 81121-6 may be fixed to the first alignment frame 8111. The sixth motor 81121-6 may include a linear motor and linearly reciprocate along the first direction (e.g., the −z-axis direction). For example, the sixth motor 81121-6 may include a piezo motor, a VCM, or the like. At least a portion of the sixth motor 81121-6 may be accommodated in the sixth-first alignment hole of the sixth alignment hole 8111H6. A portion of the sixth motor 81121-6, which is accommodated in the sixth alignment hole 8111H6, may linearly reciprocate in the first direction (e.g., the −z-axis direction).

The sixth bearing 81122-6 may contact a side of the sixth motor 81121-6. The sixth bearing 81122-6 may be disposed under the sixth motor 81121-6. At least a portion of the sixth bearing 81122-6 may be accommodated in the sixth-second alignment hole of the sixth alignment hole 8111H6. Therefore, the sixth bearing 81122-6 may not be separated from the first alignment frame 8111. A side of the sixth motor 81121-6 may include an inclined surface facing between the first direction (e.g., the −z-axis direction) and the third direction (e.g., the +x-axis direction), and the sixth bearing 81122-6 may have a spherical shape. Therefore, as the first motor 81121-1 linearly reciprocates along the first direction (e.g., the −z-axis direction), the sixth bearing 81122-6 may linearly reciprocate in the third direction (e.g., the +x-axis direction).

The second alignment portion 812 may include a sixth contact member 8122-6. The sixth contact member 8122-6 may be fixed to the second alignment frame 8121 corresponding to the sixth operating portion 8112-6. The sixth contact member 8122-6 may be disposed on a side surface of the second alignment frame 8121 and contact the sixth bearing 81122-6. The sixth contact member 8122-6 may have a cylindrical disk shape. The sixth contact member 8122-6 may include a glass or the like. Therefore, the sixth bearing 81122-6 may roll or slip on the sixth contact member 8122-6.

The sixth connection member 813-6 may connect the first alignment portion 811 to the second alignment portion 812 at a location adjacent to the sixth operating portion 8112-6. Because of the sixth connection member 813-6, an attractive force may be formed between the first alignment portion 811 and the second alignment portion 812 at the location adjacent to the sixth operating portion 8112-6 parallel to the second direction (e.g., the +y-axis direction). Because of the attractive force formed by the sixth connection member 813-6, the sixth bearing 81122-6 may remain (e.g., always remain) contacting the sixth contact member 8122-6. Also, because of the attractive force formed by the sixth connection member 813-6, the sixth bearing 81122-6 may not be separated from the sixth alignment hole 8111H6.

Figure 10:
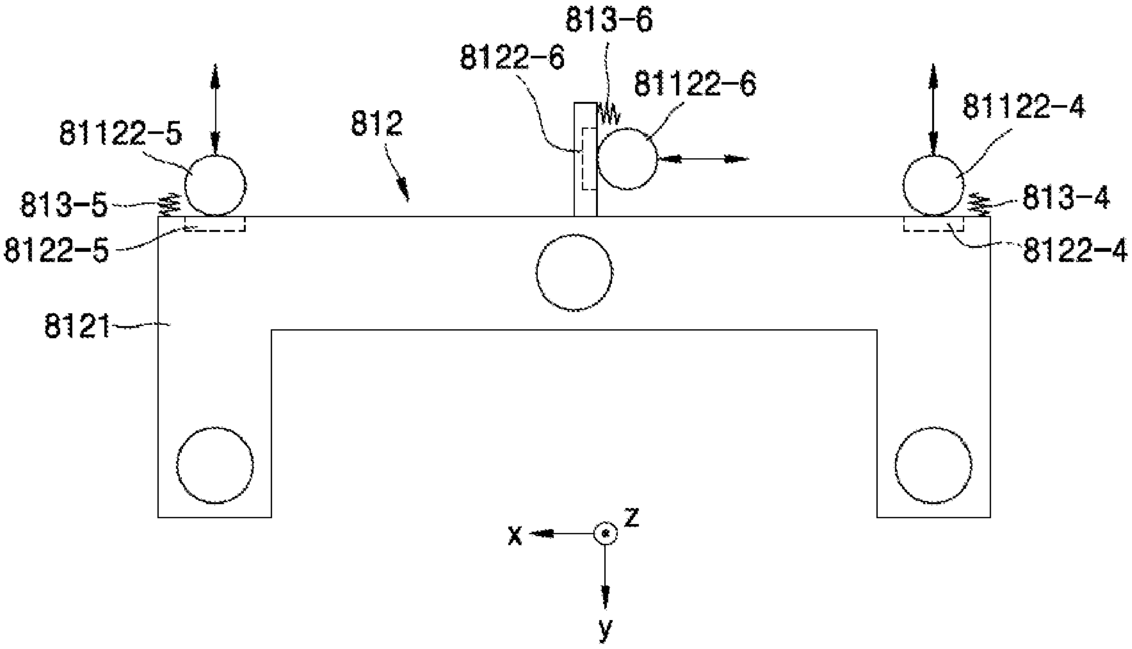
FIGS. 10 to 12 are schematic plan views of a portion of the alignment module according to an embodiment.
Figure 11:
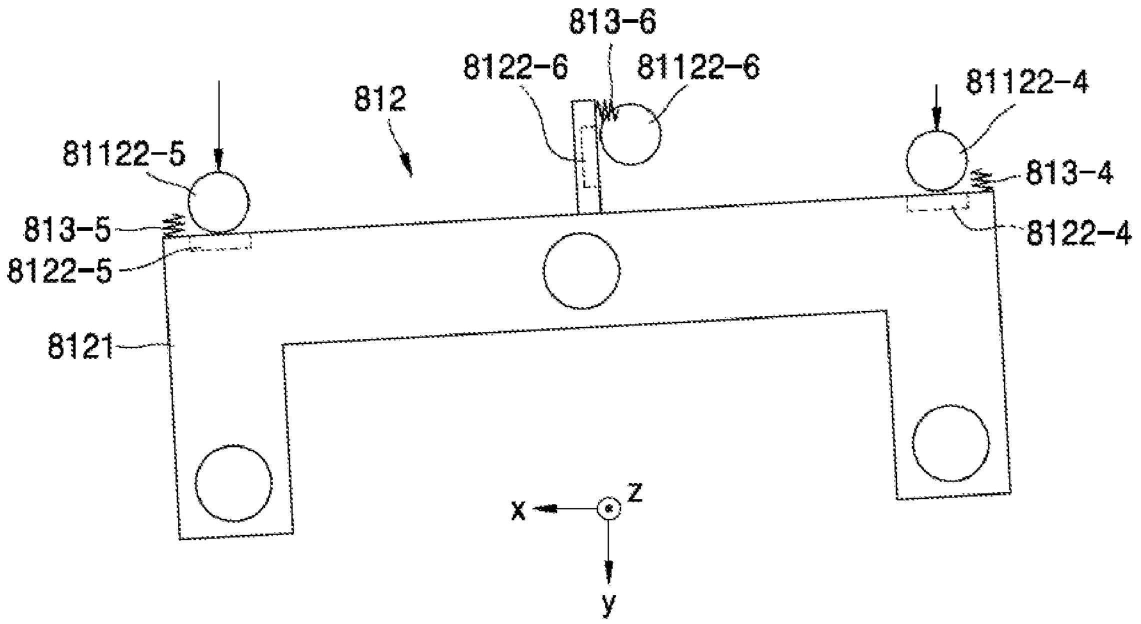
Figure 12:
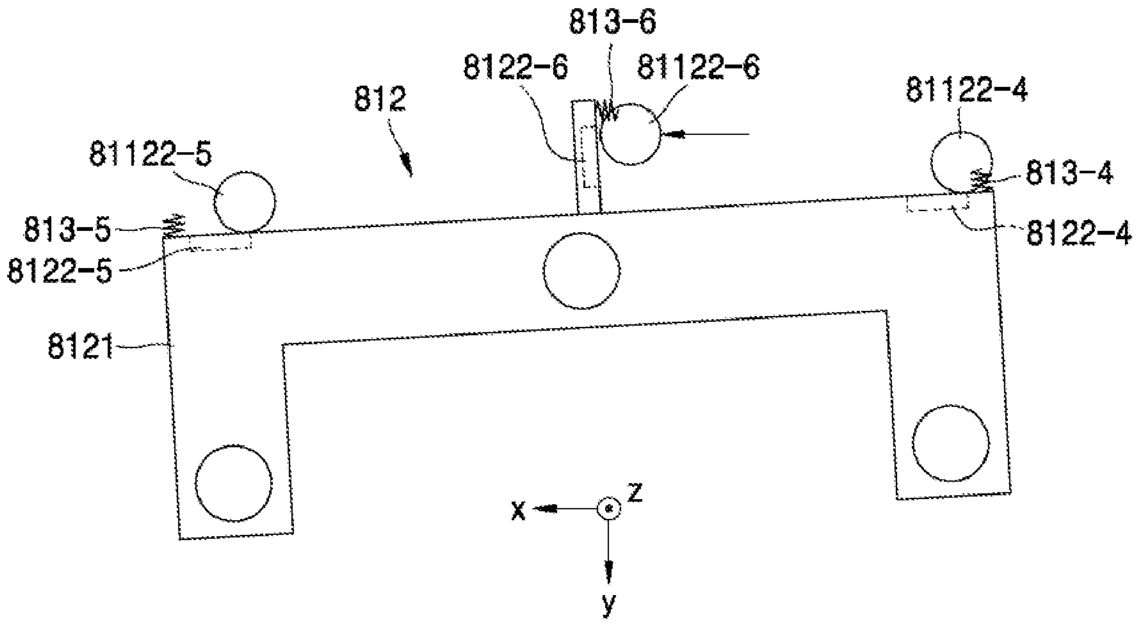

FIGS. 10 to 12 are schematic plan views of a portion of the alignment module according to an embodiment.

Referring to FIGS. 1, 2, and 7 to 12, the alignment module 81 may align the head 82 by a movement of the head 82 in the second direction (e.g., the +y-axis direction), the movement of the head 82 in the third direction (e.g., the +x-axis direction), and a rotation about the first direction (e.g., the −z-axis direction).

The fourth contact member 8122-4, the fifth contact member 8122-5, and the sixth contact member 8122-6 may be arranged at different locations. The fourth contact member 8122-4 and the fifth contact member 8122-5 may be arranged in a direction (e.g., a −y-axis direction) opposite to the second direction (e.g., the +y-axis direction), and the sixth contact member 8122-6 may be arranged in a direction (e.g., a −x-axis direction) opposite to the third direction (e.g., the +x-axis direction). Accordingly, the fourth bearing 81122-4 corresponding to the fourth contact member 8122-4, the fifth bearing 81122-5 corresponding to the fifth contact member 8122-5, and the sixth bearing 81122-6 corresponding to the sixth contact member 8122-6 may contact the second alignment frame 8121 at different locations. The fourth connection member 813-4 corresponding to the fourth contact member 8122-4, the fifth connection member 813-5 corresponding to the fifth contact member 8122-5, and the sixth connection member 813-6 corresponding to the sixth contact member 8122-6 may also be connected to the second alignment frame 8121 at different locations.

For example, the fourth operating portion 8112-4, the fifth operating portion 8112-5, and the sixth operating portion 8112-6 may contact the second alignment portion 812 at different locations, and the fourth connection member 813-4, the fifth connection member 813-5, and the sixth connection member 813-6 may connect the first alignment portion 811 to the second alignment portion 812 at different locations. As the fourth operating portion 8112-4, the fifth operating portion 8112-5, and the sixth operating portion 8112-6 operate, the movement of the head 82 fixed to the second alignment portion 812 in the second direction (e.g., the +y-axis direction), the movement of the second alignment portion 812 in the third direction (e.g., the +x-axis direction), and the rotation of the second alignment portion 812 about the first direction (e.g., the −z-axis direction) may occur.

Referring to FIG. 11, the fourth bearing 81122-4 and the fifth bearing 81122-5 may move in the second direction (e.g., the +y-axis direction). As the fourth bearing 81122-4 and the fifth bearing 81122-5 move in the second direction (e.g., the +y-axis direction), the fourth contact member 8122-4 and the fifth contact member 8122-5 may be pressed in the second direction (e.g., the +y-axis direction). Therefore, the second alignment portion 812 may move in the second direction (e.g., the +y-axis direction). As shown in FIG. 11, a movement distance of the fourth bearing 81122-4 may be greater than a movement distance of the fifth bearing 81122-5. The second alignment portion 812 may rotate counter-clockwise about the first direction (e.g., the +z-axis direction).

Referring to FIG. 12, the sixth bearing 81122-6 may move in the third direction (e.g., the +x-axis direction). As the sixth bearing 81122-6 moves in the third direction (e.g., the +x-axis direction), the sixth contact member 8122-6 may be pressed in the third direction (e.g., the +x-axis direction). Therefore, the second alignment portion 812 may move in the third direction (e.g., the +x-axis direction).

The processes described with reference to FIGS. 11 and 12 are merely embodiments for explaining a process in which the alignment module 81 aligns the head 82, and the disclosure is not limited thereto. For example, unlike the processes described with reference to FIGS. 11 and 12, the fourth bearing 81122-4 and the fifth bearing 81122-5 may move in a direction (e.g., the −y-axis direction) opposite to the second direction (e.g., the +y-axis direction), and the sixth bearing 81122-6 may move in a direction (e.g., the −x-axis direction) opposite to the third direction (e.g., the +x-axis direction).

In the process of aligning the head 82 which is described with reference to FIGS. 7 to 12, the flatness of the head 82, which has already been adjusted in the process described with reference to FIGS. 5 and 6, may not change. For example, the process of aligning the head 82 that is described with reference to FIGS. 7 to 12 may not interfere with the process of aligning the head 82 that is described with reference to FIGS. 5 and 6. With the above structure, the head 82 may be aligned more quickly.

Referring to FIGS. 1 to 12, all of the first motor 81121-1, the second motor 81121-2, the third motor 81121-3, the fourth motor 81121-4, the fifth motor 81121-5, and the sixth motor 81121-6 may linearly move in the first direction (e.g., the ±z-axis direction). The first motor 81121-1, the second motor 81121-2, the third motor 81121-3, the fourth motor 81121-4, the fifth motor 81121-5, and the sixth motor 81121-6 may be arranged on side surfaces of the head 82 and surround the head 82. The first operating portion 8112-1, the second operating portion 8112-2, the third operating portion 8112-3, the fourth operating portion 8112-4, the fifth operating portion 8112-5, and the sixth operating portion 8112-6 may not overlap the upper surface (e.g., the surface in the +z-axis direction) of the head 82 in a plan view (e.g., a −z-axis direction). In the above structure, the first operating portion 8112-1, the second operating portion 8112-2, the third operating portion 8112-3, the fourth operating portion 8112-4, the fifth operating portion 8112-5, and the sixth operating portion 8112-6 may be arranged not to interfere with a connection path through which ink is provided from the connection frame 70 to the head 82. Also, a spatial efficiency of the alignment module 81 may be improved.

Also, the head 82 may be aligned at six points by using the first operating portion 8112-1, the second operating portion 8112-2, the third operating portion 8112-3, the fourth operating portion 8112-4, the fifth operating portion 8112-5, and the sixth operating portion 8112-6. Therefore, an accuracy of aligning the head 82 may be improved.

Figure 13:
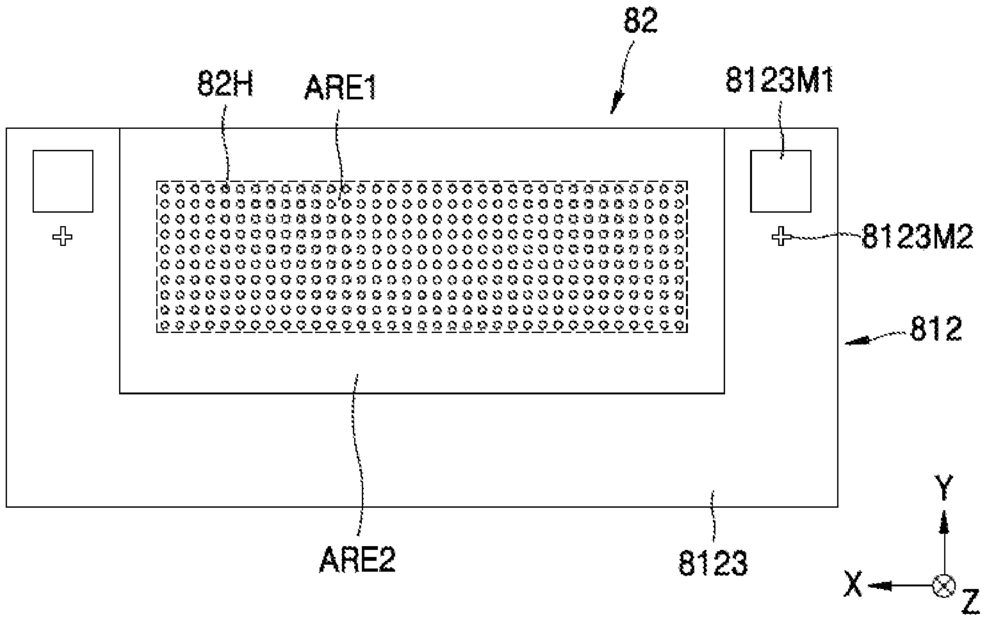
FIG. 13 is a schematic bottom view of an ink ejection module according to an embodiment.

FIG. 13 is a schematic bottom view of an ink ejection module according to an embodiment.

Referring to FIG. 13, an area of the lower surface (e.g., a surface in the −z-axis direction) of the head 82, which is exposed from the alignment module 81, may include a first area ARE1, where multiple ejection holes 82H for ejecting ink are arranged, and a second area ARE2, where no ejection holes 82H are arranged. For example, the first area ARE1 may be surrounded by the second area ARE2 in a bottom view. For example, the first area ARE1 may have a rectangular shape in a bottom view. However, the arrangements and shapes of the first area ARE1 and the second area ARE2 are not limited thereto.

On the lower surface (e.g., the surface in the −z-axis direction) of the fixing part 8123 of the second alignment portion 812, a first mark 8123M1 and a second mark 8123M2 may be arranged. For example, the first mark 8123M1 and the second mark 8123M2 may each be provided at multiple different locations. FIG. 13 shows that the first mark 8123M1 has a square shape, and the second mark 8123M2 has a cross shape in a bottom view. However, the shapes of the first mark 8123M1 and the second mark 8123M2 are not limited thereto.

Referring to FIGS. 1 and 13, the controller 91 may primarily align the alignment module 81 and then secondarily align the ink ejection module 80 using the sensor 90.

In the process in which the controller 91 primarily aligns the alignment module 81, the sensor 90 may sense location information of the alignment module 81. For example, the sensor 90 may sense the first mark 8123M1 and the second mark 8123M2 (e.g., location information of the first mart 8123M1 and the second mark 8123M2) which are arranged on the fixing part 8123.

The controller 91 may analyze the location of the alignment module 81 based on the location information of the alignment module 81 that is sensed by the sensor 90, and may align the alignment module 81.

The controller 91 may analyze the flatness of the lower surface (e.g., the surface in the −z-axis direction) of the fixing part 8123, based on the information regarding the first mark 8123M1 that is sensed by the sensor 90. Based on the analyzed information (e.g., an information of the flatness of the lower surface of the fixing part 8123), the controller 91 may align the alignment module 81 such that the flatness of the lower surface (e.g., the surface in the −z-axis direction) of the fixing part 8123 is in parallel to the display substrate DS disposed on the stage 20.

Based on the information regarding the second mark 8123M2 that is sensed by the sensor 90, the controller 91 may analyze location information of the lower surface (e.g., the surface in the −z-axis direction) of the fixing part 8123 in the second direction (e.g., the +y-axis direction), location information of the lower surface of the fixing part 8123 in the third direction (e.g., the +x-axis direction), and a distortion degree in the first direction (e.g., the −z-axis direction). Based on the analyzed information (e.g., the location information of the lower surface of the fixing part 8123 in the second direction, location information of the lower surface of the fixing part 8123 in the third direction, and the distortion degree in the first direction), the controller 91 may align the alignment portion 81 through a movement of the second alignment portion 812 in the second direction (e.g., the +y-axis direction), the movement of the second alignment portion 812 in the third direction (e.g., the +x-axis direction), and a rotation of the second alignment portion 812 about the first direction (e.g., the −z-axis direction).

In the process in which the controller 91 secondarily aligns the alignment module 81, the sensor 90 may sense the location information of the head 82. For example, the sensor 90 may sense the first area ARE1 and the second area ARE2 (e.g., an information regarding the first area ARE1 and the second area ARE2) of the lower surface (e.g., the surface in the −z-axis direction) of the head 82. For example, the sensor 90 may sense information regarding the ejection holes 82H arranged in the first area ARE1.

The controller 91 may analyze the location of the alignment module 81 based on the location information of the head 82 that is sensed by the sensor 90, and may align the alignment module 81.

The controller 91 may analyze the flatness of the lower surface (e.g., the surface in the −z-axis direction) of the head 82 based on the information regarding the first area ARE1 of the head 82 which is sensed by the sensor 90. Based on the analyzed information (e.g., an information of the flatness of the lower surface of the head 82), the controller 91 may align the alignment module 81 such that the flatness of the lower surface (e.g., the surface in the −z-axis direction) of the head 82 is in parallel to the display substrate DS disposed on the stage 20.

Based on the information regarding the ejection holes 82H arranged in the first area ARE1 in the head 82, the controller 91 may analyze location information of the lower surface (e.g., the surface in the −z-axis direction) of the fixing part 8123 in the second direction (e.g., the +y-axis direction), location information of the lower surface of the fixing part 8123 in the third direction (e.g., the +x-axis direction), and a distortion degree in the first direction (e.g., the −z-axis direction). Based on the analyzed information (e.g., the location information of the lower surface of the fixing part 8123 in the second direction, the location information of the lower surface of the fixing part 8123 in the third direction, and the distortion degree in the first direction), the controller 91 may align the alignment portion 81 through a movement of the second alignment portion 812 in the second direction (e.g., the +y-axis direction), a movement of the second alignment portion 812 in the third direction (e.g., the +x-axis direction), and a rotation of the second alignment portion 812 about the first direction (e.g., the −z-axis direction).

In the process in which the controller 91 primarily aligns the alignment module 81, the head 82 may be primarily aligned. In the process in which the controller 91 secondarily aligns the alignment module 81, the head 82 may be more precisely aligned. As the controller 91 primarily aligns the alignment module 81 and secondarily aligns the alignment module 81, a time taken to finally align the alignment module 81 may be reduced, and the alignment module 81 may be aligned more accurately.

Figure 14:
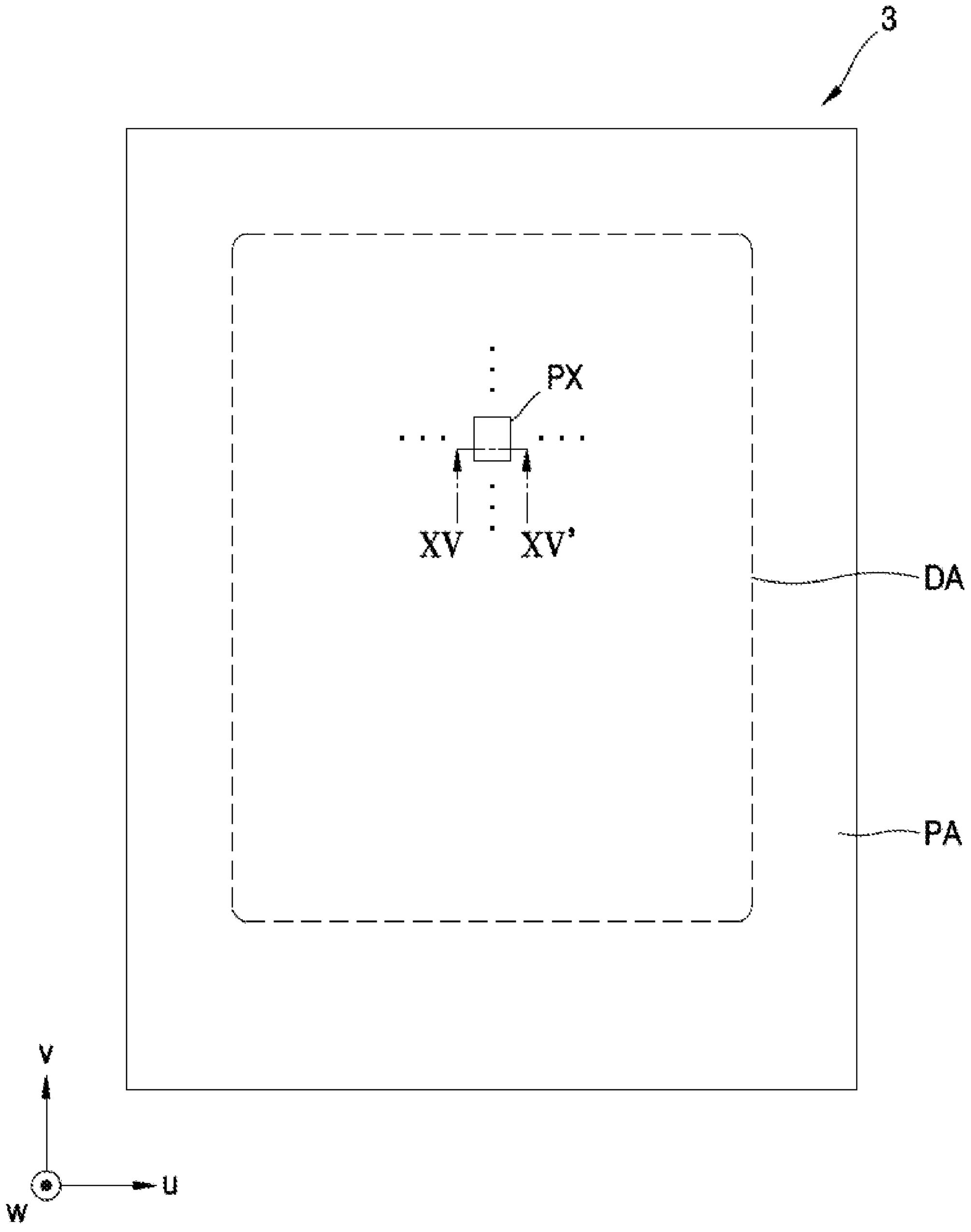
FIG. 14 is a schematic plan view of a display apparatus according to an embodiment.

FIG. 14 is a schematic plan view of a display apparatus according to an embodiment.

Referring to FIG. 14, a display apparatus 3 manufactured according to an embodiment may include a display area DA and a peripheral area PA adjacent to the display area DA. The display apparatus 3 may provide an image through an array of pixels PX that are two-dimensionally arranged in the display area DA (e.g., a u direction and a v direction intersecting the u direction).

The peripheral area PA may be an area where no images are displayed and may surround (e.g., entirely or partially surround) the display area DA. In the peripheral area PA, drivers or the like that provide electrical signals or power to pixel circuits corresponding to the pixels PX may be arranged. In the peripheral area PA, a pad that may be electrically connected to an electronic component, a printed circuit board, or the like may be arranged.

Hereinafter, it is described that the display apparatus 3 includes organic light-emitting diodes (OLEDs) as light-emitting elements, but the display apparatus 3 is not limited thereto. In another embodiment, the display apparatus 3 may be a light-emitting display apparatus including inorganic light-emitting diodes, for example, an inorganic light-emitting display apparatus. The inorganic light-emitting diode may include a PN diode including a material of an inorganic semiconductor. In case that a voltage is applied to a PN junction diode in a forward direction, electrons and holes may be injected, and energy generated from a recombination of the electrons and holes may be converted to light energy so that colors of light (e.g., certain or selectable colors of light) may be emitted. The inorganic light-emitting diode may have a width in a range of several to several hundred micrometers, and in an embodiment, the inorganic light-emitting diode may be a micro LED. In another embodiment, the display apparatus 3 may be a quantum dot light-emitting display apparatus.

The display apparatus 3 may be used as a display screen of various products, for example, a portable electronic apparatus such as a mobile phone, a smartphone, a tablet Personal Computer (PC), a mobile communication terminal, a personal digital assistant, an e-book terminal, a Portable Multimedia Player (PMP), a navigation device, an Ultra Mobile PC (UMPC), or the like, a television (TV), a laptop, a monitor, a billboard, Internet of Things (IoT) device, and the like. Also, in an embodiment, the display apparatus 3 may be used in a wearable device, such as a smartwatch, a watch phone, an eyewear display, a head-mounted display (HMD), or the like. Also, in an embodiment, the display apparatus 3 may be used as a display screen in an instrument cluster of a vehicle, a Center Information Display (CID) mounted on a center fascia, a dashboard of a vehicle, or the like, a room mirror display replacing a side-view mirror of a vehicle, a car headrest monitor provided for rear-seat entertainment, or the like.

Figure 15:
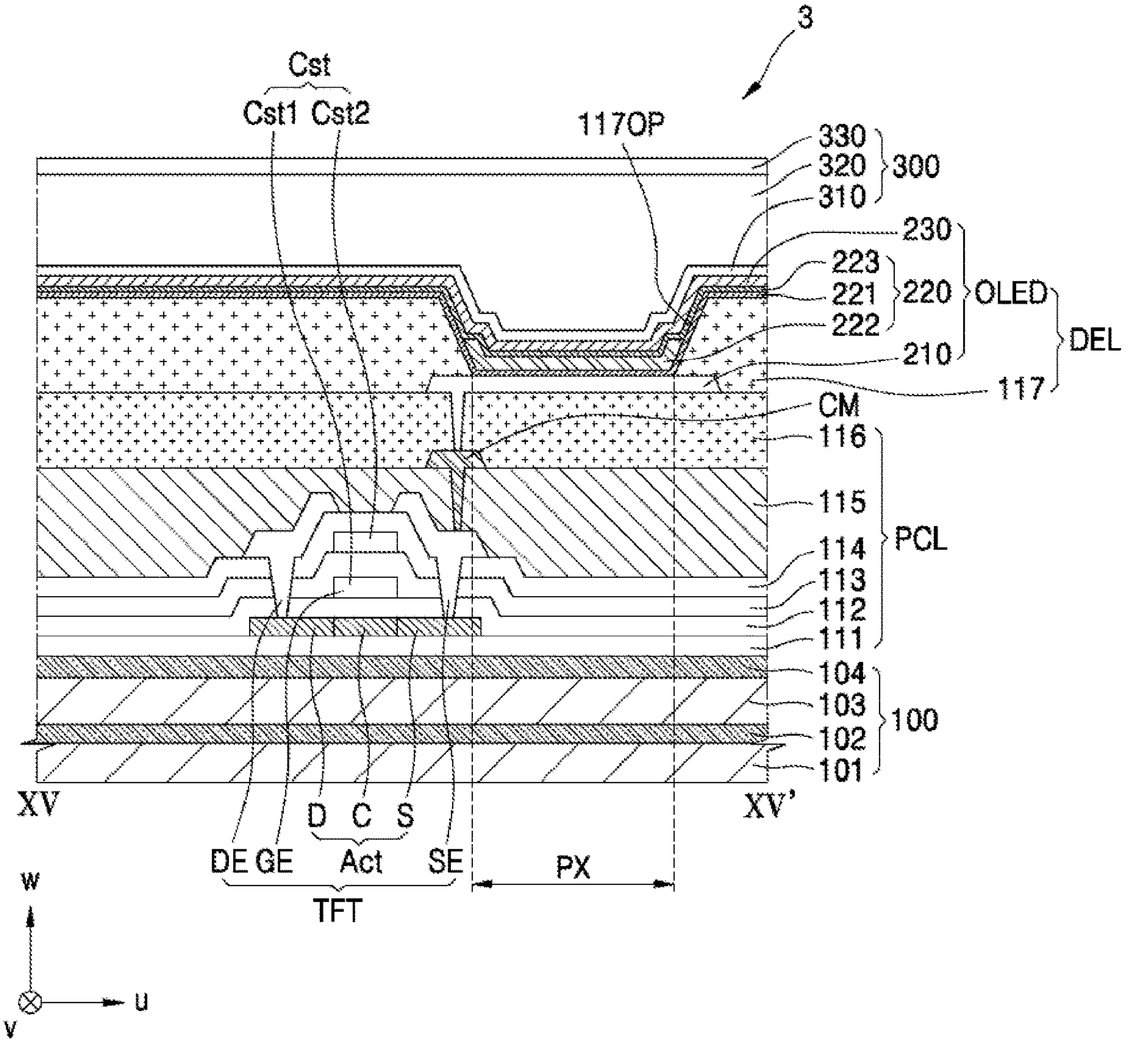
FIG. 15 is a schematic cross-sectional view of a display apparatus according to an embodiment.

FIG. 15 is a schematic cross-sectional view of a display apparatus according to an embodiment. FIG. 15 may correspond to a schematic cross-sectional view of the display apparatus taken along line XV-XV' of FIG. 14.

Referring to FIG. 15, the display apparatus 3 may have a stack structure including a substrate 100, a pixel circuit layer PCL, a display element layer DEL, and an encapsulation layer 300.

The substrate 100 may have a multilayered structure that includes a base layer including a polymer resin and an inorganic layer. For example, the substrate 100 may include the base layer including a polymer resin and a barrier layer of an inorganic insulating layer. For example, the substrate 100 may include a first base layer 101, a first barrier layer 102, a second base layer 103, and a second barrier layer 104 which are sequentially stacked. The first base layer 101 and the second base layer 103 may include polyimide (PI), polyethersulfone (PES), polyarylate, polyetherimide (PEI), polyethylene napthalate (PEN), polyethylene terephthalate (PET), polyphenylene sulfide (PPS), polycarbonate, cellulose triacetate (TAC), and/or cellulose acetate propionate (CAP). The first barrier layer 102 and the second barrier layer 104 may include an inorganic insulating material, such as silicon oxide ($SiO_2$), silicon nitride ($SiN_x$), silicon oxynitride (SiON), and/or the like. The substrate 100 may be flexible.

The pixel circuit layer PCL may be disposed on the substrate 100. FIG. 15 shows that the pixel circuit layer PCL includes a thin-film transistor TFT, and a buffer layer 111, a first gate insulating layer 112, a second gate insulating layer 113, an interlayer insulating layer 114, a first planarization insulating layer 115, and a second planarization insulating layer 116 which are arranged on and/or under components of the thin-film transistor TFT.

The buffer layer 111 may decrease or prevent a penetration of foreign materials, moisture, external air, or the like from a bottom of the substrate 100 and provide a flat surface on the substrate 100. The buffer layer 111 may include an inorganic insulating material, such as $SiO_2$, SiON, $SiN_x$, or the like, and may have a single layer or multiple layers.

The thin-film transistor TFT on the buffer layer 111 may include a semiconductor layer Act, and the semiconductor layer Act may include polysilicon (poly-Si). In another embodiment, the semiconductor layer Act may include amorphous silicon (a-Si), an oxide semiconductor, an organic semiconductor, or the like. The semiconductor layer Act may include a channel area C and a drain area D and a source area S respectively arranged on each side of the channel area C. A gate electrode GE may overlap the channel area C in a plan view (e.g., a −w-axis direction intersecting the u-axis direction and the v-axis direction).

The gate electrode GE may include a low-resistive metal material. The gate electrode GE may include a conductive material including molybdenum (Mo), aluminum (Al), copper (Cu), titanium (Ti), or the like and may have a single layer or multiple layers.

The first gate insulating layer 112 between the semiconductor layer Act and the gate electrode GE may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), zinc oxide ($ZnO_x$), or the like. $ZnO_x$ may be zinc oxide (ZnO) and/or zinc peroxide ($ZnO_2$).

The second gate insulating layer 113 may cover the gate electrode GE. Similar to the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, $ZnO_x$, or the like. $ZnO_x$ may be ZnO and/or $ZnO_2$.

An upper electrode Cst2 of a storage capacitor Cst may be disposed on the second gate insulating layer 113. The upper electrode Cst2 may overlap the gate electrode GE arranged under the upper electrode Cst2 in a plan view (e.g., a −w-axis direction). The gate electrode GE and the upper electrode CE2, which overlap each other with the second gate insulating layer 113 disposed between the gate electrode GE and the upper electrode CE2 in a plan view (e.g., a −w-axis direction), may form the storage capacitor Cst. For example, the gate electrode GE may function as a lower electrode Cst1 of the storage capacitor Cst.

The storage capacitor Cst may overlap the thin-film transistor TFT in a plan view (e.g., a −w-axis direction). In an embodiment, the storage capacitor Cst may not overlap the thin-film transistor TFT in a plan view (e.g., a −w-axis direction).

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), Cu, and/or the like and may have a single layer or multiple layers.

The interlayer insulating layer 114 may cover the upper electrode Cst2. The interlayer insulating layer 114 may include $SiO_x$, $SiN_x$, SiON, $Al_2O_3$, $TiO_2$, $Ta_2O_5$, $HfO_2$, $ZnO_x$, or the like. $ZnO_x$ may be ZnO and/or $ZnO_2$. The interlayer insulating layer 114 may have a single layer or multiple layers.

A drain electrode DE and a source electrode SE may each be disposed on the interlayer insulating layer 114. The drain electrode DE and the source electrode SE may be respectively connected to the drain area D and the source area S through contact holes formed in insulating layers under the drain electrode DE and the source electrode SE. The drain electrode DE and the source electrode SE may each include a material having a conductivity (e.g., good conductivity).

The source electrode SE and the drain electrode DE may each include a conductive material such as Mo, Al, Cu, Ti, or the like and may have a single layer or multiple layers. In an embodiment, the drain electrode DE and the source electrode SE may have a multilayered structure of Ti/Al/Ti.

The first planarization insulating layer 115 may cover the drain electrode DE and the source electrode SE. The first planarization insulating layer 115 may include an organic insulating material, such as a general-purpose polymer such as polymethylmethacrylate (PMMA), polystyrene (PS), or the like, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, the like, or a blend thereof.

The second planarization insulating layer 116 may be disposed on the first planarization insulating layer 115. The second planarization insulating layer 116 and the first planarization insulating layer 115 may include a same material. The second planarization insulating layer 116 may include an organic insulating material, such as a general-purpose polymer such as PMMA, PS, or the like, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, the like, or a blend thereof.

The display element layer DEL may be disposed on the pixel circuit layer PCL. The display element layer DEL may include an organic light-emitting diode OLED as a display element (for example, the light-emitting element), and the organic light-emitting diode OLED may have a stacked structure including a pixel electrode 210, an intermediate layer 220, and a common electrode 230. The organic light-emitting diode OLED may emit, for example, red light, green light, or blue light or emit red light, green light, blue light, or white light. The organic light-emitting diode OLED may emit light through an emission area, and the emission area may be included in a pixel PX.

The pixel electrode 210 of the organic light-emitting diode OLED may be electrically connected to the thin-film transistor TFT through contact holes, which are formed in the second planarization insulating layer 116 and the first planarization insulating layer 115, and a contact metal CM disposed on the first planarization insulating layer 115.

The pixel electrode 210 may include a conductive oxide, such as indium tin oxide (ITO), indium zinc oxide (IZO), ZnO, indium oxide ($In_2O_3$), indium gallium oxide (IGO), aluminum zinc oxide (AZO), or the like. In an embodiment, the pixel electrode 210 may include a reflection film including Ag, Mg, Al, Pt, Pd, Au, Ni, Nd, Ir, Cr, the like, or a compound thereof. In an embodiment, the pixel electrode 210 may further include a film including ITO, IZO, ZnO, $In_2O_3$, or the like, on/under the above reflection film.

A bank layer 117 including an opening 117OP may be disposed on the pixel electrode 210, the opening 117OP exposing a central portion of the pixel electrode 210. The bank layer 117 may include an organic insulating material and/or an inorganic insulating material. The opening 117OP may define an emission area of light emitted from the organic light-emitting diode OLED. For example, a size/width of the opening 117OP may correspond to a size/width of the emission area. Therefore, the size and/or the width of the pixel PX may depend on the size and/or the width of the opening 117OP of the bank layer 117.

The intermediate layer 220 may include an emission layer 222 formed corresponding to the pixel electrode 210. The emission layer 222 may include a high-molecular-weight or low-molecular-weight organic material emitting a color of light (e.g., a certain or selectable color of light). In another embodiment, the emission layer 222 may include an inorganic emission material or quantum dots.

In an embodiment, the intermediate layer 220 may include the emission layer 222, a first functional layer 221 disposed under the emission layer 222, and a second functional layer 223 disposed on the emission layer 222. The first functional layer 221 may include, for example, a Hole Transport Layer (HTL) or the HTL and a Hole Injection Layer (HIL). The second functional layer 223 may be a component disposed on the emission layer 222 and include an Electron Transport Layer (ETL) and/or an Electron Injection Layer (EIL). The first functional layer 221 and/or the second functional layer 223 may each be a common layer formed to cover (entirely cover) the substrate 100 like a common electrode 230 described below.

The common electrode 230 may be disposed on the pixel electrode 210 and overlap the pixel electrode 210 in a plan view (e.g., a –w-axis direction). The common electrode 230 may include a conductive material having a low work function. For example, the common electrode 230 may include a transparent (or translucent) layer including Ag, Mg, Al, Pt, Pd, Au, Ni, Nd, Ir, Cr, lithium (Li), Ca, the like, or an alloy thereof. In another embodiment, the common electrode 230 may further include a layer including ITO, IZO, ZnO, $In_2O_3$, or the like on the transparent (or translucent) layer. The common electrode 230 may be integrally formed (or a single layer) to entirely cover the substrate 100.

The encapsulation layer 300 may be disposed on the display element layer DEL and cover the display element layer DEL. The encapsulation layer 300 may include at least one inorganic encapsulation layer and at least one organic encapsulation layer, and in an embodiment, as shown in FIG. 15, the encapsulation layer 300 may include a first inorganic encapsulation layer 310, an organic encapsulation layer 320, and a second inorganic encapsulation layer 330 which are sequentially stacked.

The first inorganic encapsulation layer 310 and the second inorganic encapsulation layer 330 may each include at least one inorganic material of $Al_2O_3$, $TiO_2$, $Ta_2O_5$, $HfO_2$, $ZnO_x$, $SiO_2$, $SiN_x$, and SiON. The organic encapsulation layer 320 may include a polymer-based material or the like. The polymer-based material may include an acrylic resin, an epoxy-based resin, PI, polyethylene, or the like. In an embodiment, the organic encapsulation layer 320 may include acrylate or the like. The organic encapsulation layer 320 may be formed by curing a monomer, applying a polymer, or the like. The organic encapsulation layer 320 may be transparent.

Although not shown in FIG. 15, on the encapsulation layer 300, a touch sensor layer may be disposed, and an optical functional layer may be disposed on the touch sensor layer. The touch sensor layer may obtain coordinate information according to an external input, (e.g., a touch event). The optical functional layer may reduce a reflectivity of light (external light) that is incident on the display apparatus 3 from the outside and/or may improve the color purity of light emitted from the display apparatus 3. In an embodiment, the optical functional layer may include a retarder and/or a polarizer. The retarder may be a film type retarder, a liquid crystal coating type retarder, or the like and may include a $\lambda/2$ retarder and/or a $\lambda/4$ retarder. The polarizer may be a film type polarizer, a liquid crystal coating type polarizer, or the like. The film type polarizer may include a stretched synthetic resin film or the like, and the liquid crystal coating type polarizer may include liquid crystals arranged in an arrangement (e.g., a certain or selectable arrangement). The retarder and the polarizer may further include a protective film.

An adhesive member may be arranged between the touch electrode layer and the optical functional layer. General adhesive members may be employed without limitation. The adhesive member may be a pressure-sensitive adhesive (PSA) or the like.

At least one of the pixel circuit layer PCL, the display element layer DEL, and the encapsulation layer 300 may include the ink discharged from the head 82 described with reference to FIGS. 1 to 13.

Figure 16:
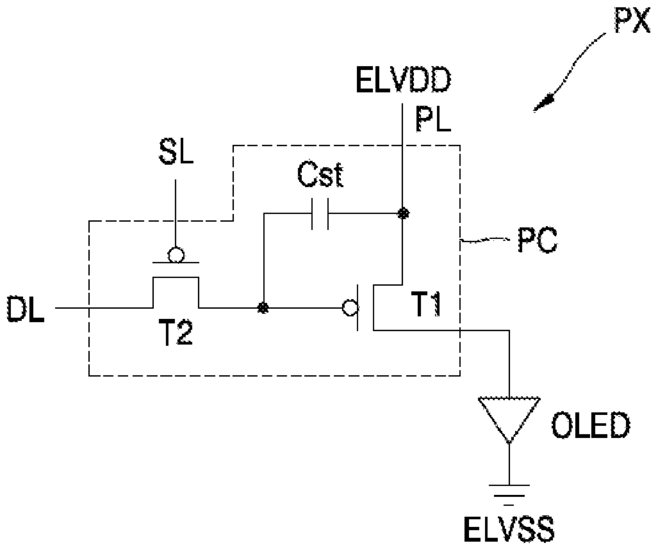
FIG. 16 is a schematic diagram of an equivalent circuit of a pixel included in a display panel according to an embodiment.

FIG. 16 is a schematic diagram of an equivalent circuit of a pixel included in a display panel according to an embodiment.

Each pixel PX may include a pixel circuit PC and a display element, for example, an organic light-emitting diode OLED, which is connected to the pixel circuit PC. The pixel circuit PC may include a first thin-film transistor T1, a second thin-film transistor T2, and a storage capacitor Cst. Each pixel PX may emit, for example, red light, green light, blue light, or white light by using the organic light-emitting diode OLED.

The second thin-film transistor T2 may be a switching thin-film transistor, may be connected to a scan line SL and a data line DL, and may transmit, to the first thin-film transistor T1, a data voltage that is input through the data line DL, based on a switching voltage that is input through the scan line SL. The storage capacitor Cst may be connected to the second thin-film transistor T2 and a driving power line PL and store a voltage corresponding to a voltage difference between a voltage from the second thin-film transistor T2 and a first power voltage ELVDD provided to the driving power line PL.

The first thin-film transistor T1 may be a driving thin-film transistor, may be connected to the driving power line PL and the storage capacitor Cst, and may control a driving current flowing to the organic light-emitting diode OLED from the driving power line PL, according to a voltage stored in the storage capacitor Cst. The organic light-emitting diode OLED may emit light having a brightness (e.g., a certain or selectable brightness), according to the driving current. An opposite electrode (e.g., a cathode) of the organic light-emitting diode OLED may receive a second power voltage ELVSS.

FIG. 16 shows that the pixel circuit PC includes two thin-film transistors (e.g., T1 and T2) and one storage capacitor (e.g., Cst), but the disclosure is not limited thereto. The number of transistors and the number of storage capacitors may vary depending on a design of the pixel circuit PC. For example, the pixel circuit PC may include four or more thin-film transistors.

According to an embodiment, ink may be quickly sprayed to an accurate location on a display substrate DS, and a quality and production speed of a display apparatus 3 may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An apparatus for manufacturing a display apparatus, the apparatus comprising:
- a stage on which a substrate is mounted; and
- an ink ejection module that discharges ink onto the substrate, wherein the ink ejection module comprises:
  - a head comprising a plurality of ejection holes through which the ink is sprayed; and
  - an alignment module that is connected to the head and aligns the head,
- the alignment module comprises:
  - a first alignment portion; and
  - a second alignment portion which moves relative to the first alignment portion and to which the head is fixed,
- the first alignment portion comprises:
  - a first alignment frame; and
  - a first operating portion that is fixed to the first alignment frame and presses the second alignment portion in a first direction, and
- the first operating portion comprises:
  - a first motor fixed to the first alignment frame and linearly moving in the first direction; and
  - a first bearing having a spherical shape, contacting a side of the first motor, and linearly moving in the first direction.

2. The apparatus of claim 1, wherein the alignment module further comprises a first connection member connecting the first alignment portion to the second alignment portion such that an attractive force parallel to the first direction is applied between the first alignment portion and the second alignment portion.

3. The apparatus of claim 1, wherein the second alignment portion comprises:
- a second alignment frame; and
- a first contact member comprising a glass, fixed to the second alignment frame, and contacting the first bearing.

4. The apparatus of claim 1, wherein
- the first alignment portion comprises:
  - a second operating portion that is fixed to the first alignment frame and presses the second alignment portion in the first direction; and
  - a third operating portion that is fixed to the first alignment frame and presses the second alignment portion in the first direction, and
- the first operating portion, the second operating portion, and the third operating portion are fixed to the first alignment frame at different locations.

5. The apparatus of claim 1, further comprising:
- a sensor that senses location information of the alignment module; and
- a controller that controls the ink ejection module,
- wherein the controller primarily aligns the ink ejection module based on the location information of the alignment module.

6. The apparatus of claim 5, wherein
- the sensor senses location information of the head, and
- the controller secondarily aligns the ink ejection module based on the location information of the head.

7. An apparatus for manufacturing a display apparatus, the apparatus comprising:
- a stage on which a substrate is mounted; and
- an ink ejection module that discharges ink onto the substrate, wherein
- the ink ejection module comprises;
  - a head comprising a plurality of ejection holes through which the ink is sprayed; and
  - an alignment module that is connected to the head and aliens the head,
- the alignment module comprises:
  - a first alignment portion; and
  - a second alignment portion which moves relative to the first alignment portion and to which the head is fixed,
- the first alignment portion comprises;
  - a first alignment frame; and
- a first operating portion that is fixed to the first alignment frame and presses the second alignment portion in a first direction, wherein the first alignment portion further comprises a fourth operating portion that is fixed to the first alignment frame and presses the second alignment portion in a second direction intersecting the first direction.

8. The apparatus of claim 7, wherein the alignment module further comprises a fourth connection member connecting the first alignment portion to the second alignment portion such that an attractive force parallel to the second direction is applied between the first alignment portion and the second alignment portion.

9. The apparatus of claim 7, wherein the fourth operating portion comprises:
- a fourth motor fixed to the first alignment frame, linearly moving in the first direction, and comprising an inclined surface; and
- a fourth bearing having a spherical shape, contacting the inclined surface of the fourth motor, and linearly moving in the second direction.

10. The apparatus of claim 9, wherein the second alignment portion comprises:
- a second alignment frame; and
- a fourth contact member comprising a glass, fixed to the second alignment frame, and contacting the fourth bearing.

11. The apparatus of claim 7, wherein
- the first alignment portion further comprises a fifth operating portion that is fixed to the first alignment frame and presses the second alignment portion in the second direction, and
- the fifth operation portion and the fourth operating portion are fixed to the first alignment frame at different locations.

12. The display apparatus of claim 11, wherein
- the first alignment portion further comprises a sixth operating portion that is fixed to the first alignment frame and presses the second alignment portion in a third direction intersecting the first direction and the second direction, and
- the fourth operating portion, the fifth operating portion, and the sixth operation portion are fixed to the first alignment frame at different locations.

13. The apparatus of claim 12, wherein the alignment module further comprises a sixth connection member connecting the first alignment portion to the second alignment portion such that an attractive force parallel to the third direction is applied between the first alignment portion and the second alignment portion.

14. The apparatus of claim 12, wherein the sixth operating portion comprises:
- a sixth motor fixed to the first alignment frame, linearly moving in the first direction, and comprising an inclined surface; and
- a sixth bearing having a spherical shape, contacting the inclined surface of the sixth motor, and linearly moving in the third direction.

15. The apparatus of claim 14, wherein the second alignment portion comprises:
- a second alignment frame; and
- a sixth contact member comprising a glass, fixed to the second alignment frame, and contacting the sixth bearing.

16. An alignment module comprising:
- a first alignment portion; and
- a second alignment portion which moves relative to the first alignment portion and to which a head is fixed, wherein
- the first alignment portion comprises:
  - a first alignment frame; and
  - a first operating portion that is fixed to the first alignment frame and presses the second alignment portion in a first direction, and
- the first operating portion comprises:
  - a first motor fixed to the first alignment frame and linearly moving in the first direction; and
  - a first bearing having a spherical shape, contacting a side of the first motor, and linearly moving in the first direction.

17. Alignment module of claim 16, further comprising:
- a first connection member connecting the first alignment portion to the second alignment portion such that an attractive force parallel to the first direction is applied between the first alignment portion and the second alignment portion.

18. The alignment module of claim 16, wherein the second alignment portion comprises:
- a second alignment frame; and
- a first contact member comprising a glass, fixed to the second alignment frame, and contacting the first bearing.

* * * * *